United States Patent
Ueda et al.

(10) Patent No.: US 11,615,957 B2
(45) Date of Patent: Mar. 28, 2023

(54) METHOD FOR FORMING BORON-BASED FILM, FORMATION APPARATUS

(71) Applicant: TOKYO ELECTRON LIMITED, Tokyo (JP)

(72) Inventors: Hirokazu Ueda, Nirasaki (JP); Jinwang Li, Nirasaki (JP); Masahiro Oka, Nirasaki (JP); Yoshimasa Watanabe, Nirasaki (JP); Yuuki Yamamoto, Nirasaki (JP); Hiroyuki Ikuta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 194 days.

(21) Appl. No.: 17/041,767

(22) PCT Filed: Feb. 26, 2019

(86) PCT No.: PCT/JP2019/007273
§ 371 (c)(1),
(2) Date: Sep. 25, 2020

(87) PCT Pub. No.: WO2019/193872
PCT Pub. Date: Oct. 10, 2019

(65) Prior Publication Data
US 2021/0090888 A1 Mar. 25, 2021

(30) Foreign Application Priority Data

Apr. 4, 2018 (JP) .............................. JP2018-072625
Apr. 16, 2018 (JP) .............................. JP2018-078543

(51) Int. Cl.
*H01L 21/033* (2006.01)
*H01L 21/02* (2006.01)
*C23C 16/02* (2006.01)
*C23C 16/28* (2006.01)
*C23C 16/455* (2006.01)
*C23C 16/50* (2006.01)

(52) U.S. Cl.
CPC ...... *H01L 21/0332* (2013.01); *C23C 16/0272* (2013.01); *C23C 16/28* (2013.01); *C23C 16/45536* (2013.01); *C23C 16/50* (2013.01); *H01L 21/0228* (2013.01); *H01L 21/02274* (2013.01); *H01L 21/02304* (2013.01)

(58) Field of Classification Search
None
See application file for complete search history.

(56) References Cited

U.S. PATENT DOCUMENTS

| | | | |
|---|---|---|---|
| 2009/0044753 A1* | 2/2009 | Padhi | C23C 16/0254 118/723 E |
| 2010/0098884 A1* | 4/2010 | Balseanu | C23C 16/342 427/579 |

FOREIGN PATENT DOCUMENTS

| | | |
|---|---|---|
| JP | 2001-53010 A | 2/2001 |
| JP | 2009-152544 | 7/2009 |
| JP | 2013-110275 A | 6/2013 |

(Continued)

*Primary Examiner* — Asok K Sarkar
(74) *Attorney, Agent, or Firm* — Nath, Goldberg & Meyer; Jerald L. Meyer; Tanya E. Harkins

(57) ABSTRACT

A method of forming a boron-based film mainly containing boron on a substrate includes forming, on the substrate, an adhesion layer containing an element contained in a surface of the substrate and nitrogen, and subsequently, forming the boron-based film on the adhesion layer.

17 Claims, 9 Drawing Sheets

(56) References Cited

FOREIGN PATENT DOCUMENTS

| JP | 2013-533376 A | 8/2013 |
| JP | 2017-69330 A | 4/2017 |

* cited by examiner

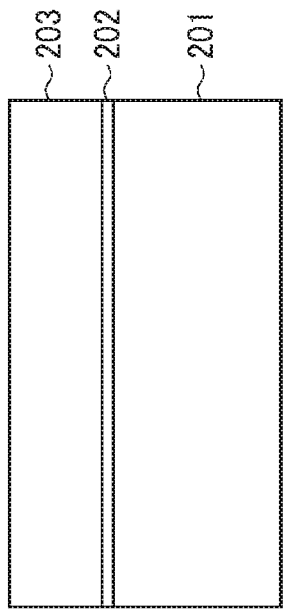
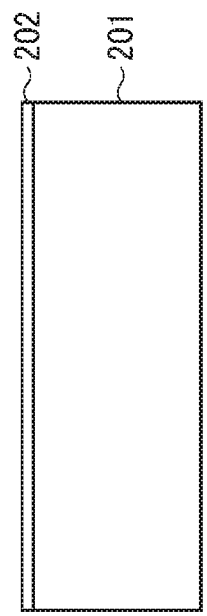

METHOD FOR FORMING BORON-BASED FILM, FORMATION APPARATUS

This is a National Phase Application filed under 35 U.S.C. 371 as a national stage of PCT/JP2019/007273, filed Feb. 26, 2019, an application claiming the benefit of Japanese Application No. 2018-072625, filed Apr. 4, 2018 and Japanese Application No. 2018-078543, filed Apr. 16, 2018, the content of each of which is hereby incorporated by reference in its entirety.

TECHNICAL FIELD

The present disclosure relates to a boron-based film formation method and a boron-based film formation apparatus.

BACKGROUND

Recently, with progress of miniaturization of semiconductor devices by the development of semiconductor manufacturing technology, semiconductor devices having a size of 14 nm or less, and specifically 10 nm or less have been manufactured. A technique for three-dimensionally constructing a semiconductor element is being developed for high integration of semiconductor devices. For this reason, the number of laminated thin films formed on a semiconductor wafer is increased. Thus, for example, in a flash memory using a three-dimensional NAND, there is required a process of performing micro-processing on a thick laminated film having a thickness of 1 μm or more and including a silicon oxide ($SiO_2$) film, a silicon nitride (SiN) film and the like, by dry etching.

Conventionally, as a hard mask for performing such a micro-processing, an amorphous silicon film or an amorphous carbon film is used but has low etching resistance. Therefore, when these films are used as a hard mask, it is necessary to form a film having a thick thickness of 1 μm or more.

As a next-generation hard mask material, a film made of a metallic material, for example, tungsten, and having higher etching resistance than an amorphous silicon film or an amorphous carbon film, has been studied. However, for the metallic material-made film such as a tungsten film having a very high etching resistance, it is difficult to take measures against peeling, metal contamination or the like after dry etching.

In view of this, a boron-based film has been studied as a new hard mask material having higher dry etching resistance than an amorphous silicon film or an amorphous carbon film and a high selectivity with respect to a $SiO_2$ film or the like. Patent Document 1 discloses that a boron-based film formed through CVD can be used as a hard mask. In general, a film formed through CVD or the like is required to have adhesion to an underlying film.

PRIOR ART DOCUMENTS

Patent Document

Patent Document 1: Japanese laid-open publication No. 2013-533376

SUMMARY

The present disclosure provides a boron-based film formation method and a boron-based film formation apparatus which are capable of forming a boron-based film with good adhesion.

According to an embodiment of the present disclosure, a method of forming a boron-based film mainly containing boron on a substrate includes forming, on the substrate, an adhesion layer containing an element contained in a surface of the substrate and nitrogen, and subsequently, forming the boron-based film on the adhesion layer.

According to the present disclosure, it is possible to provide a boron-based film formation method and a boron-based film formation apparatus which are capable of forming a boron-based film with good adhesion.

BRIEF DESCRIPTION OF DRAWINGS

FIGS. 2A and 2B are cross-sectional views schematically illustrating respective steps of the boron-based film formation method according to the first embodiment.

DETAILED DESCRIPTION

Hereinafter, embodiments will be described with reference to the accompanying drawings.

First Embodiment

First, a first embodiment will be described.

History of First Embodiment

First, a history of a boron-based film formation method according to a first embodiment will be described. Boron-based films are promising as hard masks, and are formed through CVD in the related art. Among the boron-based films, a boron film containing boron alone is known to have excellent properties.

On the other hand, the boron-based films formed through CVD do not always have sufficient adhesion to a substrate. From the viewpoint of preventing film peeling during a device integration manufacturing process, it is required to improve the adhesion of the boron-based films to the substrate.

As a technique for improving the adhesion of a film, in general, there is a technique of performing a surface treatment (a cleaning process, and a surface modification process with plasma) on a substrate. However, the effect of improving the adhesion of the boron-based films by such a technique has not been confirmed.

Therefore, as a result of studies, the present inventors have found that it is effective to form an intermediate layer including an element contained in a surface of the substrate and nitrogen, on the substrate, and subsequently, form a boron-based film on the substrate.

Boron-Based Film Formation Method According to First Embodiment

Figure 1:
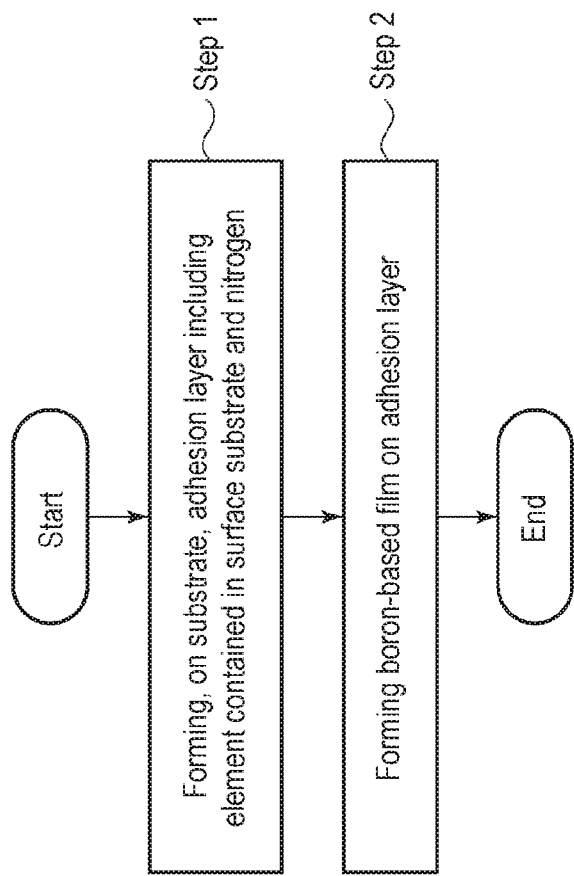
FIG. 1 is a flowchart illustrating a boron-based film formation method according to a first embodiment.

Next, the boron-based film formation method according to the first embodiment will be described. FIG. 1 is a flowchart illustrating the boron-based film formation method according to the first embodiment, and FIGS. 2A and 2B are cross-sectional views schematically illustrating respective steps of the boron-based film formation method according to the first embodiment.

The boron-based film formation method according to the present embodiment includes step 1 and step 2. Step 1 is a step of forming, on a substrate 201, an adhesion layer 202 containing an element contained in a surface of the substrate and nitrogen (N) (see FIG. 2A). Step 2 performed subsequently is a step of forming a boron-based film 203 on the adhesion layer 202 (see FIG. 2B).

The substrate 201 may be, for example, a semiconductor substrate (semiconductor wafer). The substrate 201 may be a substrate alone or a substrate having a predetermined film thereon. The substrate 201 preferably contains Si in the surface thereof. The substrate containing Si in the surface thereof may be, for example, a single silicon (Si) substrate (silicon wafer), or may be a substrate on which a Si-containing film, for example, a $SiO_2$ film, is formed on a base.

The formation of the adhesion layer 202 in step 1 may be performed through CVD such as thermal CVD or plasma CVD, ALD for forming a film by alternately supplying a raw material gas and a reaction gas (thermal ALD or plasma ALD), or PVD such as sputtering. From the viewpoint of forming a good film on a fine pattern, CVD and ALD are preferable. Particularly, the plasma CVD or the plasma ALD that is capable of forming a film having good film quality is preferable. The plasma is not particularly limited. For example, capacitively coupled plasma, inductively coupled plasma, or microwave plasma may be used as the plasma. Particularly, the microwave plasma is preferable due to the fact that the microwave plasma has a low electron temperature and mainly composed of radicals, and has an advantage of being capable of generating high-density plasma with low damage.

The adhesion layer 202 may have such a thickness so as to improve the adhesion of the boron-based film. The thickness of the adhesion layer 202 is preferably 100 nm or less, more preferably 50 nm or less. More preferably, the thickness is 5 to 10 nm.

As described above, the adhesion layer 202 includes an element contained in the substrate surface and N. This is because the adhesion layer 202 includes the element contained in the surface of the substrate so that a bond with the substrate is easily formed, and because the adhesion layer 202 includes the nitrogen so that a strong and stable B—N bond with the boron-based film is easily formed. Since the adhesion layer 202 forms a good bond with the substrate 201 and the boron-based film 203, the adhesion between the substrate 201 and the boron-based film 203 can be enhanced.

The B—N bond is a bond that forms boron nitride (BN). BN has no melting point, sublimates at 2,700 degrees C., and does not dissolve in water. Therefore, the B—N bond becomes a strong and stable bond. Besides nitrogen, there is oxygen as an element that easily bonds with B. However, since $B_2O_3$ having a B—O bond has a melting point of 480 degrees C. and is soluble in water, it is considered that the B—O bond is weaker than the B—N bond.

When the surface of the substrate 201 includes Si, for example, when the substrate 201 has Si alone or has a $SiO_2$ film formed on the surface thereof, a material containing Si and N is used as the material of the adhesion layer 202. Examples of the material may include SiN ($Si_3N_4$), Si—N:H (Si—N containing hydrogen), Si—C—N, Si—B—N, Si—O—N, and the like.

When forming the adhesion layer 202 through CVD or ALD, a processing gas including a gas containing an element contained in the substrate surface and a gas containing N is used. When a film containing Si and N, for example, a SiN film, is formed as the adhesion layer 202, a Si-containing gas is used as the gas containing the element contained in the substrate surface. As the Si-containing gas, a silane-based gas such as a $SiH_4$ gas, an aminosilane-based gas, a chlorosilane-based gas such as $SiH_2Cl_2$, or the like, may be used. As the N-containing gas, a $N_2$ gas or a $NH_3$ gas may be used.

The formation of the boron-based film in step 2 may be performed through CVD such as thermal CVD or plasma CVD, or PVD such as sputtering. From the viewpoint of forming a good film for a fine pattern, CVD is preferable, and, of the thermal CVD and the plasma CVD, the CVD, the plasma CVD capable of forming a film having good film quality is preferable. The plasma by the plasma CVD is not particularly limited, but may be capacitively coupled plasma, inductively coupled plasma, microwave plasma, or the like. Particularly, the microwave plasma is preferable due to the fact that the microwave plasma has a low electron temperature and mainly composed of radicals, and has an advantage of being capable of generating high-density plasma with low damage.

A boron-based film has a characteristic of high etching resistance. The boron-based film 203 is applicable as a hard mask by taking advantage of such a characteristic. The thickness of the boron-based film 203 is appropriately set depending on the intended use. When the boron-based film 203 is applied as a hard mask, the boron-based film 203 may be formed to have a thickness of, for example, 1 μm or more.

The boron-based film may be a film mainly composed of boron and containing boron at an amount of 50 at % or more, a boron film composed of boron and inevitable impurities, or a film in which another element, such as nitrogen (N), carbon (C), silicon (Si) or the like, is intentionally added to boron. However, from the viewpoint of obtaining high etching resistance, a boron film containing no other additive element is preferable. A boron-based film formed through CVD mainly contains hydrogen (H) at an amount of about 5 to 15 at % as inevitable impurities derived from a film-forming raw material or the like in the film.

When the boron-based film is formed through CVD, a processing gas containing a boron-containing gas is used. When the boron-based film is formed through plasma CVD, the processing gas may contain a noble gas for plasma excitation. When a boron-based film in which another element is added to boron is used, a gas containing an element to be further added may be used as the processing gas. The processing gas may also contain hydrogen gas.

The boron-containing gas may be, for example, a diborane ($B_2H_6$) gas, a boron trichloride ($BCl_3$) gas, an alkylborane gas, a decaborane gas, or the like. The alkylborane gas may be, for example, a trimethylborane (B(CH$_3$)$_3$) gas, a triethylborane (B(C$_2$H$_5$)$_3$) gas, a gas represented by B(R1)(R2)(R3), B(R1)(R2)H, or B(R1)H$_2$ (R1, R2, and R3 are alkyl groups), or the like. Among them, the B$_2$H$_6$ gas may be appropriately used.

When the boron-based film 203 is formed through CVD, for example, the plasma CVD, a pressure is preferably in a range of 0.67 to 133.3 Pa (5 to 1,000 mTorr), and the temperature is preferably in a range of 500 degrees C. or less (more preferably, in a range of 60 to 500 degrees C., e.g., 300 degrees C.).

In this way, by forming the boron-based film 203 on the substrate 201 via the adhesion layer 202, it is possible to improve the adhesion of the boron-based film 203 compared to the case where the boron-based film is directly formed on the substrate, by the effect of the adhesion layer 202 described above.

It is preferable to continuously perform the formation of the adhesion layer 202 in step 1 and the formation of the boron-based film 203 in step 2 inside the same chamber without breaking a vacuum state. This makes it possible to form the boron-based film 203 with high throughput and good adhesion without contaminating the interface between the adhesion layer 202 and the boron-based film 203. Further, steps 1 and 2 may be film formation methods of the same system. For example, when the boron-based film 203 is formed through the plasma CVD, the adhesion layer 202 may be formed through the plasma CVD or the plasma ALD.

When steps 1 and 2 are performed through the plasma CVD (also including the plasma ALD), both steps may be performed at a pressure in a range of 0.67 to 133.3 Pa (5 to 1,000 mTorr) and at a temperature in a range of 500 degrees C. or less. Steps 1 and 2 may be performed at the same temperature.

First Example of Boron-Based Film Formation Apparatus Used in First Embodiment

Figure 3:
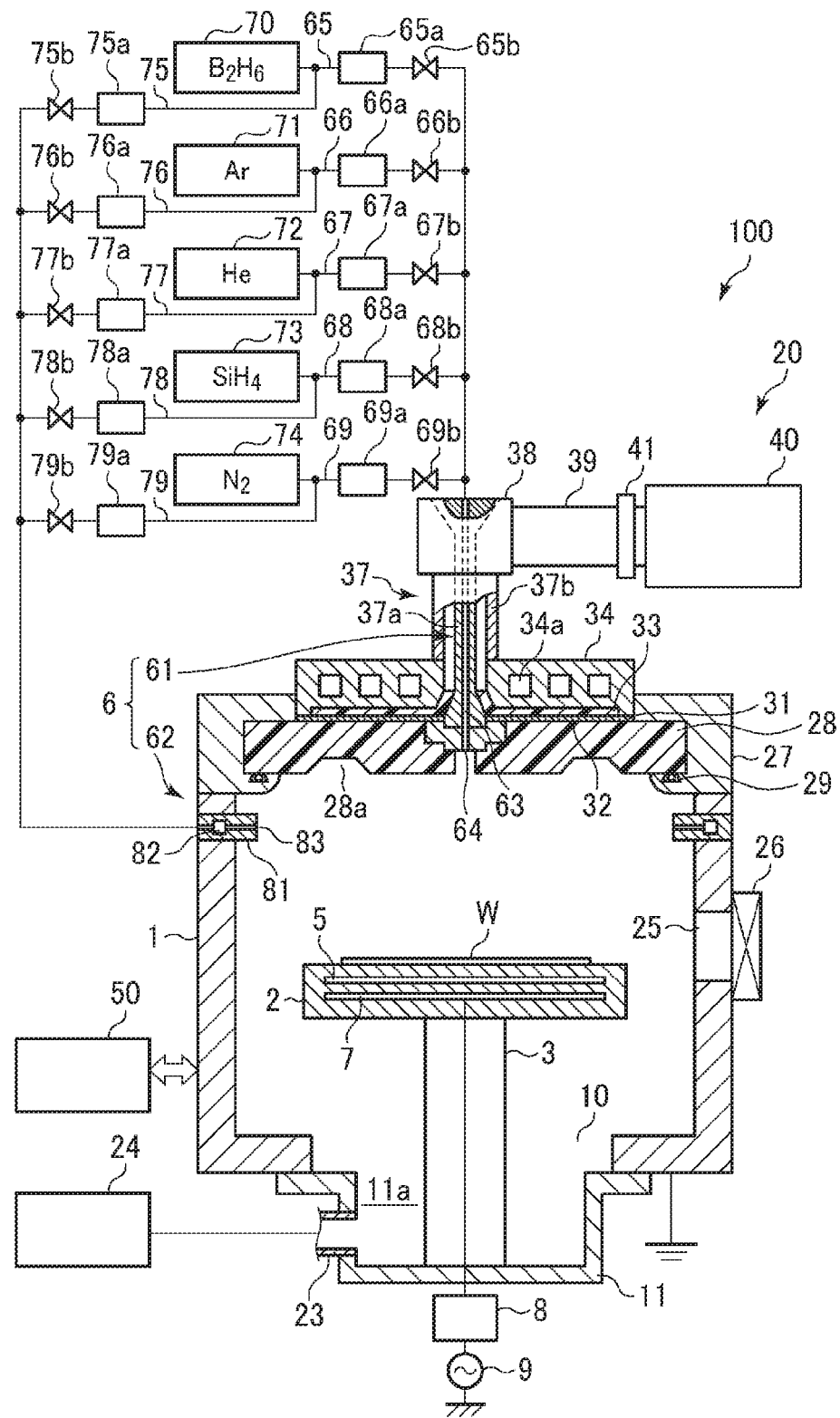
FIG. 3 is a cross-sectional view illustrating a first example of a boron-based film formation apparatus used in the first embodiment.

Next, a first example of a boron-based film formation apparatus used in the first embodiment will be described. FIG. 3 is a cross-sectional view illustrating the first example of the boron-based film formation apparatus used in the first embodiment. The boron-based film formation apparatus 100 is configured as a microwave plasma CVD apparatus that performs the above steps 1 and 2 so as to form a boron film as a boron-based film.

The film formation apparatus 100 has a substantially grounded airtight cylindrical chamber 1. The chamber 1 is made of a metallic material such as aluminum or an alloy thereof. A microwave plasma source 20 is provided above the chamber 1. The microwave plasma source 20 is configured as, for example, an RLSA (registered trademark) microwave plasma source.

A circular opening portion 10 is formed in a substantially central portion of a bottom wall of the chamber 1. An exhaust room 11 that communicates with the opening portion 10 and protrudes downward is provided in the bottom wall.

Inside the chamber 1, a disc-shaped stage 2 made of ceramic such as AlN is provided to horizontally support a semiconductor wafer (hereinafter, simply referred to as a "wafer") W, which is a substrate. The stage 2 is supported by a cylindrical support member 3 made of ceramic such as AlN and extending upward from the center of the bottom of the exhaust room 11. In addition, a resistance-heating-type heater 5 is embedded in the stage 2. The heater 5 generates heat by being supplied with power from a heater power supply (not illustrated). Thus, the wafer W is heated to a predetermined temperature via the stage 2. An electrode 7 is embedded in the stage 2. A high-frequency power supply for bias voltage application 9 is connected to the electrode 7 via a matcher 8. The high-frequency power supply for bias voltage application 9 applies high-frequency power (high-frequency bias) of 50 kHz to 13.56 MHz to the stage 2. The power of the high-frequency bias is variable and may be changed in a range of, for example, 30 to 500 W. The matcher 8 matches a load impedance with an internal (or output) impedance of the high-frequency power supply for bias voltage application 9. That is, the matcher 8 functions such that the internal impedance of the high-frequency power supply for bias voltage application 9 apparently match with the load impedance when plasma is being generated inside the chamber 1.

The stage 2 is provided with wafer support pins (not illustrated) for supporting and moving the wafer W up and down while being moved up and down on the upper surface of the stage 2.

An exhaust pipe 23 is connected to a side surface of the exhaust room 11. An exhaust device 24 including a vacuum pump, an automatic pressure control valve and the like, is connected to the exhaust pipe 23. By operating the vacuum pump of the exhaust device 24, the gas in the chamber 1 is uniformly discharged into a space 11$a$ of the exhaust room 11 and is exhausted through the exhaust pipe 23, and the interior of the chamber 1 is controlled to have a predetermined level of vacuum by the automatic pressure control valve.

The sidewall of the chamber 1 includes a loading/unloading port 25 for loading/unloading the wafer W into/from a vacuum transfer chamber (not illustrated) provided adjacent to the film formation apparatus 100. The loading/unloading port 25 is opened and closed by a gate valve 26.

An upper portion of the chamber 1 constitutes an opening portion. A periphery of the opening portion constitutes a ring-shaped support portion 27. The microwave plasma source 20 is supported by the support portion 27.

The microwave plasma source 20 includes a disc-shaped microwave transmission plate 28 made of a dielectric material, a planar slot antenna 31 having a plurality of slots, a retardation material 33, a coaxial waveguide 37, and a mode converter 38, a waveguide 39, and a microwave generator 40. As the dielectric material constituting the microwave transmission plate 28, for example, quartz or ceramic such as Al$_2$O$_3$ may be used.

The microwave transmission plate 28 is air-tightly provided on the support portion 27, with a seal member 29. Therefore, the chamber 1 is hermetically sealed.

The planar slot antenna 31 has a disc shape corresponding to the microwave transmission plate 28, is made of a conductive material, and is provided so as to be in close contact with the microwave transmission plate 28. The planar slot antenna 31 is locked to an upper end of the side wall of the chamber 1.

The planar slot antenna 31 is made of, for example, a copper plate or an aluminum plate, the surface of which is plated with silver or gold, and has a configuration in which a plurality of slots 32 for radiating microwaves therethrough are formed so as to penetrate the planar slot antenna 31 in a predetermined pattern. The pattern of the slots 32 may be appropriately set such that the microwaves are evenly radiated. An example of the pattern may be a pattern in which a plurality of pairs of slots 32 are concentrically arranged, with each pair composed of two slots 32 paired in a T shape. The length and the arrangement interval of the slots 32 are determined depending on an effective wavelength λg of the microwaves. For example, the slots 32 are arranged such that the intervals therebetween are λg/4, λg/2, or λg. The slots 32 may have another shape, such as a circular shape or an arc shape. The arrangement form of the slots 32 is not particularly limited, and the slots 32 may be arranged, for example, in a spiral shape or a radial shape, in addition to the concentric circle shape.

The retardation material 33 is provided to be in close contact with an upper surface of the planar slot antenna 31. The retardation material 33 is made of a dielectric having a dielectric constant higher than a vacuum, for example, quartz, ceramic ($Al_2O_3$), resin such as polytetrafluoroethylene, polyimide or the like. The retardation material 33 has a function of making the wavelength of the microwaves shorter than that in a vacuum, thereby reducing the size of the planar slot antenna 31.

The thicknesses of the microwave transmission plate 28 and the retardation material 33 are adjusted such that an equivalent circuit formed by the retardation plate 33, the planar slot antenna 31, the microwave transmission plate 28 and plasma satisfies a resonance condition. By adjusting the thickness of the retardation material 33, the phase of the microwaves can be adjusted. By adjusting the thickness of the planar slot antenna 31 such that a joint portion of the planar slot antenna 31 becomes an "antinode" of the standing wave, the reflection of microwaves is minimized and the radiant energy of microwaves is maximized. In addition, by fabricating the retardation material 33 and the microwave transmission plate 28 using the same material, it is possible to prevent the interface reflection of microwaves.

The planar slot antenna 31 and the microwave transmission plate 28 may be disposed to be spaced apart from each other, and the retardation material 33 and the planar slot antenna 31 may also be disposed to be spaced apart from each other.

A cooling jacket 34 made of a metallic material, such as aluminum, stainless steel, copper or the like, is provided on the top surface of the chamber 1 so as to cover the planar slot antenna 31 and the retardation material 33. A cooling water flow path 34a is formed in the cooling jacket 34. The retardation material 33, the planar slot antenna 31, and the microwave transmission plate 28 are cooled by circulating the cooling water through the cooling water flow path 34a.

The coaxial waveguide 37 is inserted toward the microwave transmission plate 28 from above an opening formed in the center of an upper wall of the cooling jacket 34. The coaxial waveguide 37 includes a hollow rod-shaped inner conductor 37a and a cylindrical outer conductor 37b, which are concentrically arranged. A lower end of the inner conductor 37a is connected to the planar slot antenna 31. The coaxial waveguide 37 extends upward. The mode converter 38 is connected to an upper end of the coaxial waveguide 37. One end of a horizontally-extending waveguide 39 having a rectangular cross section is connected to the mode converter 38. A microwave generator 40 is connected to the other end of the waveguide 39. A matching circuit 41 is provided in the waveguide 39.

The microwave generator 40 generates microwaves having a frequency of, for example, 2.45 GHz. The generated microwaves propagate through the waveguide 39 in a TE mode. The mode converter 38 converts a vibration mode of the microwaves from the TE mode to a TEM mode. The microwaves converted to the TEM mode propagate toward the retardation material 33 through the coaxial waveguide 37. Then, the microwaves spread radially in the interior of the retardation material 33 outward of the radial direction, and are radiated from the slots 32 of the planar slot antenna 31. The radiated microwaves pass through the microwave transmission plate 28 to generate an electric field in a region directly below the microwave transmission plate 28 inside the chamber 1, thus generating microwave plasma. In a portion of the lower surface of the microwave transmission plate 28, there is formed an annular recess 28a that is recessed in a tapered shape to facilitate the generation of the standing wave by the introduced microwaves. This makes it is possible to efficiently generate the microwave plasma.

In addition to 2.45 GHz, various frequencies, such as 8.35 GHz, 1.98 GHz, 860 MHz, 915 MHz and the like, may be used as the frequency for the microwaves. The microwave power may be 2,000 to 5,000 W, and the power density may be 2.8 to 7.1 $W/cm^2$.

The film formation apparatus 100 has a gas supply mechanism 6 configured to supply processing gases for forming the boron-based film and the adhesion layer. The processing gas for forming the boron-based film contains a boron-containing gas. As described above, examples of the boron-containing gas may include a diborane ($B_2H_6$) gas, a boron trichloride ($BCl_3$) gas, an alkylborane gas, a decaborane gas, or the like.

The processing gas for forming the boron-based film may include a noble gas for plasma excitation. Further, the processing gas may include a $H_2$ gas or the like. A He gas, an Ar gas or the like may be used as the noble gas.

The processing gas for forming the adhesion layer contains a Si-containing gas and an N-containing gas. As described above, examples of the Si-containing gas may include a silane-based gas such as a $SiH_4$ gas, an aminosilane-based gas, a chlorosilane-based gas such as a $SiH_2Cl_2$ gas or the like. Examples of the N-containing gas may include a $N_2$ gas, a $NH_3$ gas, or the like. Further, the above-mentioned noble gas may be used as the processing gas for forming the adhesion layer.

In the following, a case in which the processing gas containing the $B_2H_6$ gas as a boron-containing gas, the Ar gas and the He gas as a noble gas, the $SiH_4$ gas as a Si-containing gas, and the $N_2$ gas as an N-containing gas is used will be described by way of an example.

The gas supply mechanism 6 includes a first gas supply part 61 configured to eject gas toward the center of the wafer W, and a second gas supply part 62 configured to eject gas from the outside of the wafer W. The first gas supply part 61 includes a gas flow path 63 formed inside the mode converter 38 and the inner conductor 37a of the coaxial waveguide 37. A gas supply port 64 at the tip end of the gas flow path 63 is opened toward the chamber 1, for example, at the central portion of the microwave transmission plate 28. Pipes 65, 66, 67, 68, and 69 are connected to the gas flow path 63. A $B_2H_6$ gas source 70 is connected to the pipe 65 to supply the $B_2H_6$ gas that is a boron-containing gas. An Ar gas source 71 is connected to the pipe 66 to supply the Ar gas that is a noble gas. A He gas source 72 is connected to the pipe 67 to supply the He gas that is a noble gas. A $SiH_4$ gas source 73 is connected to the pipe 68 to supply the $SiH_4$ gas that is a Si-containing gas. A Na gas source 74 is connected to the pipe 69 to supply the Na gas that is a N-containing gas. The pipes 65 to 69 are provided with flow rate controllers 65a to 69a, such as mass flow controllers, and opening/closing valves 65b to 69b, respectively.

The second gas supply part 62 includes a shower ring 81 provided in a ring shape along the inner wall of the chamber 1. The shower ring 81 is provided with an annular buffer room 82 and a plurality of gas ejection ports 83 provided so as to face the interior of the chamber 1 at regular intervals from the buffer room 82.

Pipes 75, 76, 77, 78, and 79 are branched from the pipes 65, 66, 67, 68, and 69, respectively. The branched pipes 75, 76, 77, 78, and 79 are joined and are connected to the buffer room 82 of the shower ring 81. The pipes 75 to 79 are provided with flow rate controllers 75a to 79a and opening/closing valves 75b to 79b, respectively.

In this example, the first gas supply part 61 and the second gas supply part 62 are supplied with the same type of gases from the same gas sources 70 to 74 with flow rates of the respective gases adjusted. These gases are ejected into the chamber 1 from the center of the microwave transmission plate 28 and the side of the peripheral edge of the chamber 1. The gases may be separately supplied from the first gas supply part 61 and the second gas supply part 62, and the flow rates thereof or the like may be adjusted individually.

From the first and second gas supply parts 61 and 62, the processing gases may be supplied at a flow rate in the range of, for example, 1,000 to 10,000 sccm, specifically 2,000 to 10,000 sccm.

The gas supply mechanism 6 includes the first and second gas supply parts 61 and 62, the $B_2H_6$ gas source 70, the Ar gas source 71, the He gas source 72, the $SiH_4$ gas source 73, and the Na gas source 74, the pipes, the flow rate controllers, the valves and the like.

The film formation apparatus 100 has a controller 50. The controller 50 controls respective components of the film formation apparatus 100, for example, the valves, the flow rate controllers, the microwave generator 40, the heater power supply, the high-frequency power supply for bias voltage application 9, and the like. The controller 50 includes a main controller equipped with a CPU, an input device, an output device, a display device, and a storage device. A storage medium that stores a program for controlling processes to be executed in the film formation apparatus 100, that is, processing recipes, is set in the storage device. The main controller reads a predetermined processing recipe stored in the storage medium, and controls the film formation apparatus 100 to execute a predetermined processing based on the processing recipe.

In the film formation apparatus 100 configured as above, first, the gate valve 26 is opened, the wafer W having the above-described configuration as a substrate is loaded into the chamber 1 and placed on the stage 2, and the gate valve 26 is closed.

At this time, the temperature of the stage 2 is set to 500 degrees C. or lower, specifically 60 to 500 degrees C., more specifically 300 degrees C. After the chamber 1 is evacuated, the Ar gas and the He gas are caused to flow into the chamber 1 to perform a cycle purging. An internal pressure of the chamber 1 obtained by the Ar gas and the He gas is set to, for example, about 53.3 Pa (400 mTorr) so as to stabilize the temperature of the wafer W. Then, the microwaves of 2,000 to 5,000 W (2.8 to 7.1 W/cm$^2$), for example, 3,500 W (5.0 W/cm$^2$) are introduced from the microwave generator 40 to perform plasma ignition. Thereafter, the internal pressure of the chamber 1 is adjusted to 0.67 to 33.3 Pa (5 to 250 mTorr), for example, 6.7 Pa (50 mTorr) while maintaining the microwave power at the same value as at the time of ignition. The $SiH_4$ gas and the $N_2$ gas are supplied from the first gas supply part 61 and the second gas supply part 62. The Ar gas and the He gas are supplied as necessary. Thus, a SiN film having a thickness of 100 nm or less is formed as an adhesion layer through the plasma CVD. At this time, the $SiH_4$ gas is supplied at a flow rate of 3 to 50 sccm, for example, 6.5 sccm, and the $N_2$ gas is supplied at a flow rate of 3 to 100 sccm, for example, 5 sccm. In addition, the Ar gas and the He gas are supplied at a total flow rate of 100 to 1,000 sccm, for example, 500 sccm. At this time, a high-frequency bias of appropriate power may be applied from the high-frequency power supply for bias voltage application 9.

The SiN film may be formed through the plasma ALD in which the supply of the $SiH_4$ gas and the supply of the $N_2$ gas are alternately repeated while performing the purging of the chamber 1 therebetween the supply of the $SiH_4$ gas and the supply of the $N_2$ gas. At this time, the plasma may be generated only when supplying the $N_2$ gas.

After the formation of the adhesion layer is completed, the supply of the $SiH_4$ gas and the supply of the $N_2$ gas are stopped, and the He gas and the Ar gas are introduced into the chamber 1 while evacuating the interior of the chamber 1, thereby purging the chamber 1. Then, while flowing the He gas and the Ar gas, the microwaves of 2,000 to 5,000 W (2.8 to 7.1 W/cm$^2$), for example, 3,500 W (5.0 W/cm$^2$), are introduced from the microwave generator 40 so as to ignite plasma. In that state, the internal pressure of the chamber 1 is adjusted to 0.67 to 33.3 Pa (5 to 250 mTorr), for example, 6.7 Pa (50 mTorr), and the $B_2H_6$ gas is supplied in addition to the He gas and the Ar gas. As a result, a boron film having a thickness of, for example, 1 µm or more, is formed as a boron-based film through the plasma CVD. At this time, the temperature of the stage 2 may be maintained at the same temperature as that when the adhesion layer was formed. Further, the $B_2H_6$ gas ($B_2H_6$ concentration: e.g., 15 vol %, He gas dilution) is supplied at a flow rate of 50 to 1,000 sccm, for example, 70 sccm ($B_2H_6$ net: 10.5 sccm). The Ar gas and the He gas are supplied at a total flow rate of 100 to 1,000 sccm, for example, 500 sccm. A high-frequency bias having an appropriate power may be applied from the high-frequency power supply for bias voltage application 9 at the time of film formation, if necessary. However, from the view point of suppressing deterioration of film quality and surface roughness of the boron film or the film peeling in the vicinity of the interface, the application of the high-frequency bias may be omitted.

In this way, the formation of the adhesion layer and the formation of the boron film are continuously performed in the state in which the wafer W is placed on the stage 2 inside the chamber 1, specifically at the same temperature without breaking a vacuum state. This makes it possible to form the boron film with good adhesion and high throughput without contaminating the interface between the adhesion layer and the boron film.

Second Example of Boron-Based Film Formation Apparatus Used in First Embodiment

Figure 4:
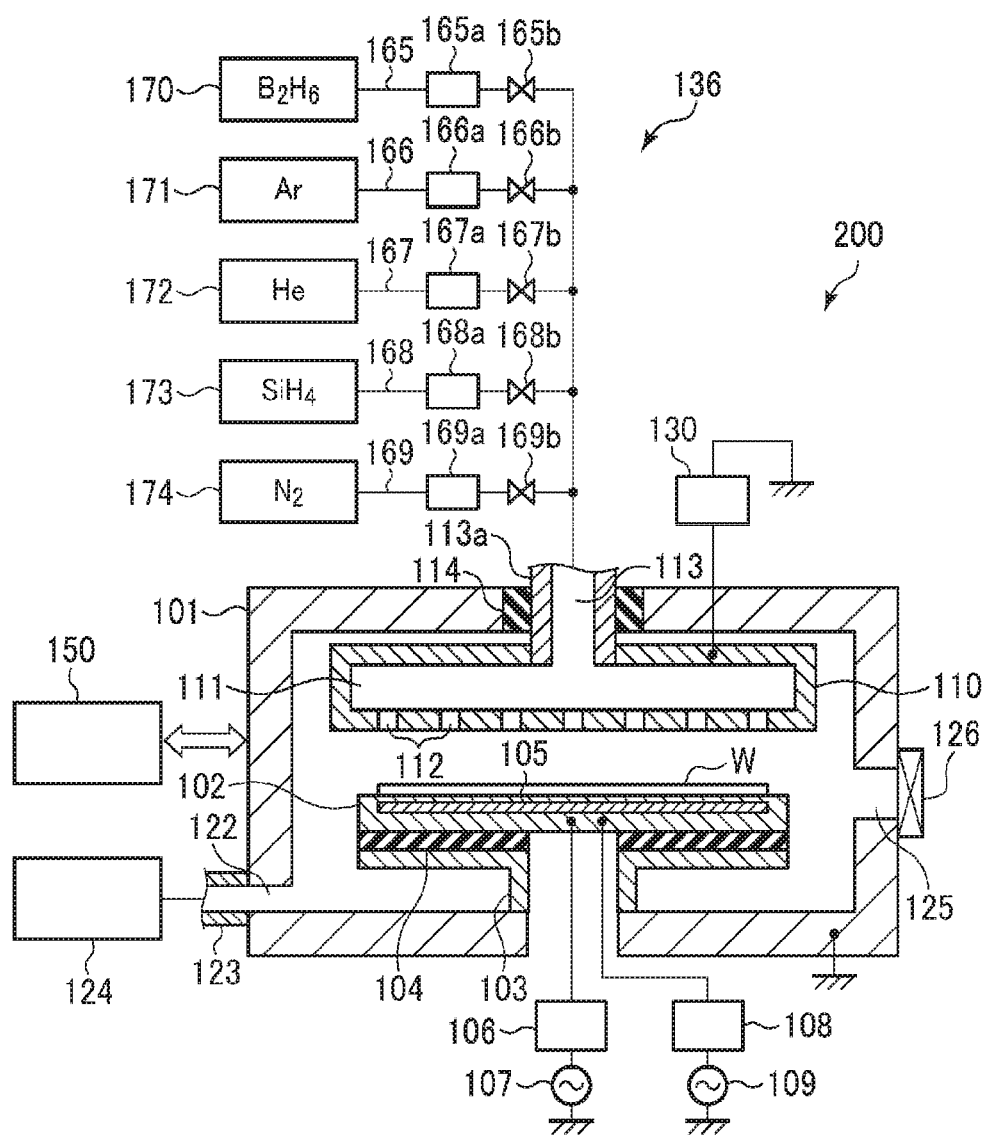
FIG. 4 is a cross-sectional view illustrating a second example of the boron-based film formation apparatus used in the first embodiment.

Next, a second example of the boron-based film formation apparatus used in the first embodiment will be described. FIG. 4 is a cross-sectional view illustrating the second example of the boron-based film formation apparatus used in the first embodiment. A film formation apparatus 200 of this example is configured as a capacitively coupled parallel planar plate plasma CVD apparatus that performs the above-described steps 1 and 2 so as to form a boron film as a boron-based film. As the wafer, a wafer containing Si in the surface thereof, for example, a wafer on which a Si-containing film such as a $SiO_2$ film is formed on a Si base is used.

The film formation apparatus 200 has a substantially grounded airtight cylindrical chamber 101. The chamber 101 is made of a metallic material such as aluminum, an alloy thereof, or the like.

On the bottom of the chamber 101, a stage 102 that functions as a lower electrode is provided to horizontally support the wafer W, which is a substrate. The stage 102 is supported via a metal-made support member 103 and an insulating member 104 arranged on a bottom surface of the chamber 101. In addition, a resistance-heating-type heater 105 is embedded in the stage 102. The heater 105 generates heat by being supplied with power from a heater power supply (not illustrated). Thus, the wafer W is heated to a predetermined temperature via the stage 102.

The film formation apparatus 200 has a gas supply mechanism 136 configured to supply processing gases for forming a boron-based film and an adhesion layer. The processing gas for forming the boron-based film contains a boron-containing gas. As described above, examples of the boron-containing gas may include a diborane ($B_2H_6$) gas, a boron trichloride ($BCl_3$) gas, an alkylborane gas, a decaborane gas, and the like.

The processing gas for forming the boron-based film may include a noble gas for plasma excitation. Further, the processing gas may include the $H_2$ gas or the like. The He gas, the Ar gas or the like may be used as the noble gas.

The processing gas for forming the adhesion layer contains a Si-containing gas and an N-containing gas. As described above, as the Si-containing gas, a silane-based gas such as a $SiH_4$ gas, an aminosilane-based gas, a chlorosilane-based gas such as a $SiH_2Cl_2$ gas, or the like, may be used. Examples of the N-containing gas may include a $N_2$ gas, a $NH_3$ gas, and the like. Further, the above-mentioned noble gas may be used as the processing gas for forming the adhesion layer.

In the following, a case in which the processing gas containing the $B_2H_6$ gas as a boron-containing gas, the Ar gas and the He gas as a noble gas, the $SiH_4$ gas as a Si-containing gas, and the $N_2$ gas as an N-containing gas is used will be described by way of an example.

The gas supply mechanism 136 includes a gas shower head 110, a $B_2H_6$ gas source 170, an Ar gas source 171, a He gas source 172, a $SiH_4$ gas source 173, a $N_2$ gas source 174, and pipes 165, 166, 167, 168, and 169.

The gas shower head 110 is provided in an upper portion of the chamber 101 so as to face the stage 102, and functions as an upper electrode. The gas shower head 110 is made of metal and has a disc shape. A gas diffusion space 111 is formed inside the gas shower head 110. A large number of gas ejection holes 112 are formed in a lower surface of the gas shower head 110.

A gas flow path 113 is connected to the central portion of an upper surface of the gas shower head 110. A gas pipe 113a constituting the gas flow path 113 is fixed to the chamber 101 via an insulating member 114. The gas shower head 110 is supported on the chamber 101 by the gas pipe 113a.

One end of each of the pipes 165, 166, 167, 168, 169 is connected to the gas flow path 113. The $B_2H_6$ gas source 170 supplies the $B_2H_6$ gas, which is a boron-containing gas, and is connected to the pipe 165. The Ar gas source 171 supplies the Ar gas, which is a noble gas, and is connected to the pipe 166. The He gas source 172 supplies the He gas, which is a noble gas, and is connected to the pipe 167. The $SiH_4$ gas source 173 supplies the $SiH_4$ gas, which is a Si-containing gas, and is connected to the pipe 168. The $N_2$ gas source 174 supplies the $N_2$ gas, which is a N-containing gas, and is connected to the pipe 169. The $B_2H_6$ gas, the Ar gas, the He gas, the $SiH_4$ gas, and the $N_2$ gas are supplied from these gas sources 170, 171, 172, 173, and 174 to the gas shower head 110 through the pipes 165, 166, 167, 168, and 169 and the gas flow path 113, respectively. These gases reach the gas diffusion space 111 and are ejected from the gas ejection holes 112 toward the wafer W inside the chamber 101.

The pipes 165 to 169 are provided with flow rate controllers 165a to 169a, such as mass flow controllers, and opening/closing valves 165b to 169b, respectively.

An exhaust port 122 is provided in a lower portion of the side wall of the chamber 101. An exhaust pipe 123 is connected to the exhaust port 122. An exhaust device 124 including a vacuum pump, a pressure control valve and the like, is connected to the exhaust pipe 123. By operating the vacuum pump of the exhaust device 124, the gas in the chamber 101 is exhausted through the exhaust pipe 123, and the interior of the chamber 101 is controlled to have a predetermined level of vacuum by the automatic pressure control valve.

The sidewall of the chamber 101 includes a loading/unloading port 125 for loading/unloading the wafer W into/from a vacuum transfer chamber (not illustrated) provided adjacent to the film formation apparatus 200. The loading/unloading port 125 is opened and closed by a gate valve 126.

The stage 102 is provided with a high-frequency power supply for plasma generation 107 configured to supply first high-frequency power of a first frequency for plasma generation, and a high-frequency power supply for bias voltage application 109 configured to supply high-frequency power of a second frequency for bias voltage application lower than the first frequency. The high-frequency power supply for plasma generation 107 is electrically connected to the stage 102 via a first matcher 106. The high-frequency power supply for bias voltage application 109 is electrically connected to the stage 102 via a second matcher 108. The high-frequency power supply for plasma generation 107 applies the first high-frequency power of 40 MHz or more, for example, 60 MHz, to the stage 102. The high-frequency power supply for bias voltage application 109 applies the second high-frequency power of 50 kHz to 13.56 MHz to the stage 102. In addition, the first high-frequency power may be applied to the gas shower head 110. An impedance adjustment circuit 130 is connected to the gas shower head 110.

The first matcher 106 matches a load impedance with an internal (or output) impedance of the high-frequency power supply for plasma generation 107. That is, the first matcher 106 functions such that the output impedance of the high-frequency power supply for plasma generation 107 apparently coincides with the load impedance when plasma is being generated inside the chamber 101. The second matcher 108 matches a load impedance with an internal (or output) impedance of the high-frequency power supply for bias voltage application 109. That is, the second matcher 108 functions such that the internal impedance of the high-frequency power supply for bias voltage application 109 apparently math with the load impedance when plasma is being generated inside the chamber 101.

By increasing the frequency of the high-frequency power supply for plasma generation 107 to 40 MHz or more and providing the impedance adjustment circuit 130, it is possible to reduce the impact of ions on the wafer W and to suppress an increase in surface roughness of the boron film.

The film formation apparatus 200 has a controller 150. The controller 150 controls respective components of the film formation apparatus 200, for example, the valves, the flow rate controllers, the heater power supply, the high-frequency power supplies 107 and 109, and the like. The controller 150 includes a main controller equipped with a CPU, an input device, an output device, a display device, and a storage device. A storage medium that stores a program for controlling processes to be executed in the film formation apparatus 200, that is, a processing recipe, is set in the storage device. The main controller reads a predetermined processing recipe stored in the storage medium, and controls the film formation apparatus 200 to execute a predetermined processing based on the processing recipe.

In the film formation apparatus 200 configured as above, first, the gate valve 126 is opened, the wafer W having the above-described configuration as a substrate is loaded into the chamber 101 and is placed on the stage 102. The gate valve 126 is closed.

The temperature of the stage 102 is set to 500 degrees C. or lower, specifically 60 to 500 degrees C., more specifically 300 degrees C. The Ar gas and the He gas are supplied into the chamber 101 to adjust the internal pressure of the chamber 101 to 0.67 to 133.3 Pa (5 to 1,000 mTorr), specifically 50 mTorr (6.7 Pa). Then, while supplying the $SiH_4$ gas and the $N_2$ gas into the chamber 101 at predetermined flow rates, the first high-frequency power for plasma generation is applied from the high-frequency power supply for plasma generation 107 to the stage 102. As a result, a high-frequency electric field is formed between the gas shower head 110, which is the upper electrode, and the stage 102, which is the lower electrode, to generate capacitively coupled plasma. Thus, a SiN film having a thickness of 100 nm or less is formed as an adhesion layer through the plasma CVD. The gas flow rate at this time may be set in the same range as that in the case of the first example of the apparatus. A high-frequency bias of appropriate power may be applied from the high-frequency power supply for bias voltage application 109 during film formation, if necessary.

The SiN film may be formed through the plasma ALD in which the supply of the $SiH_4$ gas and the supply of the $N_2$ gas are alternately repeated while performing the purging of the chamber 101 therebetween the supply of the $SiH_4$ gas and the supply of the $N_2$ gas. At this time, the plasma may be generated only when supplying the $N_2$ gas.

After the formation of the adhesion layer is completed, the supply of the $SiH_4$ gas and the supply of the $N_2$ gas are stopped, and the He gas and the Ar gas are introduced into the chamber 101 while evacuating the interior of the chamber 101, thereby purging the chamber 101. Then, while supplying the He gas and the Ar gas, the $B_2H_6$ gas is supplied into the chamber 101 at predetermined flow rates and the first high-frequency power for plasma generation is applied from the high-frequency power supply for plasma generation 107 to the stage 102. As a result, a high-frequency electric field is formed between the gas shower head 110 as the upper electrode and the stage 102 as the lower electrode, so that capacitively coupled plasma is generated. As a boron-based film, for example, a boron film having a thickness of 1 μm or more, is formed through the plasma CVD using the capacitively coupled plasma. The gas flow rate at this time may be set in the same range as that in the case of the first example of the apparatus. A high-frequency bias having an appropriate power may be applied from the high-frequency power supply for bias voltage application 109 at the time of film formation, if necessary. However, from the view point of suppressing the deterioration of film quality and surface roughness of the boron film or the film peeling in the vicinity of the interface, the application of the high-frequency bias may be omitted.

As described above, even in the film formation apparatus of the second example, the formation of the adhesion layer and the formation of the boron film are continuously performed in the state in which the wafer W is placed on the stage 102 inside the chamber 101, preferably at the same temperature without breaking a vacuum state. This makes it possible to form the boron film with good adhesion and high throughput without contaminating the interface between the adhesion layer and the boron film.

Test Examples of First Embodiment

Next, test examples of the first embodiment will be described. Here, wafers, each having a $SiO_2$ film formed on a silicon base, were used as substrates, and the microwave plasma CVD apparatus described above with reference to FIG. 3 was used to form boron films through processes of Cases 1 to 3 below.

In Case 1, the boron film was formed through steps 1 and 2 described above, according to the film formation method of the first embodiment. In step 1, the Ar gas as a plasma-generating gas, and the $SiH_4$ gas and the $N_2$ gas as film-forming gases, were used as the processing gas, the microwave power was set to 3,500 W, and the SiN film as an adhesion layer was formed at a thickness of about 10 nm through the microwave plasma CVD. In step 2, the Ar gas, which is a plasma-generating gas, and the $B_2H_6$ gas, which is a film-forming gas, were used as the processing gas, the microwave power was set to 3,500 W, and a boron film having a thickness of 1 to 1.5 μm was formed through the microwave plasma CVD.

In Case 2, only step 2 in Case 1 was performed. In Case 3, the surface treatment (treatment for removing a surface contamination portion and OH) based on the Ar plasma was first performed for 10 seconds using the microwave power of 3,500 W, and subsequently, step 2 of Case 1 was performed.

The adhesion of the films formed through respective processes of Cases 1 to 3 were evaluated using a modified-edge lift-off test (m-ELT) method. In the m-ELT method, an epoxy resin was applied to the surface of each of the formed films and was cut into a sample of a predetermined size. Then, each sample was cooled down so as to obtain adhesion strength based on the peeling start temperature and the thickness of the epoxy resin. Moreover, the situation of each sample at that time was observed. The results are represented in Table 1. The number of samples was 20 in each case.

TABLE 1

| | Case 1 | Case 2 | Case 3 |
|---|---|---|---|
| Adhesion density $K_{IC}(MPa/m^{1/2})$ | 0.386 ± 0.016 | 0.335 ± 0.033 | 0.279 ± 0.034 |
| Number of measured samples | 20 | 20 | 20 |
| Number of film-peeled samples | 5 | 6 | 15 |
| Number of peeling-mixed samples | 9 | 14 | 5 |
| Number of substrate-broken samples | 6 | 0 | 0 |

In Table 1, the item "Number of film-peeled samples" indicates the number of samples in which films were peeled in Tests, the item "Number of substrate-broken samples" indicates the number of samples in which breakage occurred in substrates in Tests, and the item "Number of peeling-mixed samples" indicates the number of samples in which film peeling and substrate breakage coexist. In the case in which breakage occurs in a substrate, the obtained adhesion strength value reflects the breakage strength of the respective substrate. Thus, it is estimated that the adhesion strength at the film interface is stronger than the breakage strength of the substrate. In addition, regarding the samples in which the film peeling and the substrate breakage coexist, it is presumed that the strength available at which the film peeling occurred and the strength available when the substrate breakage occurred close to each other.

As shown in Table 1, in Case 3 in which the boron film was formed after the surface treatment by the Ar plasma, the number of film-peeled samples was 15 and the number of peeling-mixed samples was 5, which exhibits that the number of film-peeled samples was large. The adhesion strength of the film was as small as 0.279 MPa·m$^{1/2}$. In Case 2 in which the boron film was simply formed on the substrate, the number of film-peeled samples was 6, the number of peeling-mixed samples was 14, and the number of substrate-broken samples was 0. The adhesion strength of the film was 0.335 MPa·m$^{1/2}$, which is better than that in Case 3 but was still an insufficient value. In contrast, in Case 1 in which the boron film was formed through steps 1 and 2 according to the film formation method of the first embodiment, the number of film-peeled samples was 5, which was smaller than that in Case 2, and the number of substrate-broken samples was as relatively large as 6. The adhesion strength was as high as 0.386 MPa·m$^{1/2}$. From these results, it has been confirmed that the boron film with high adhesion can be obtained by the method of the first embodiment.

Second Embodiment

Next, a second embodiment will be described.

History of Second Embodiment

First, a history of a boron-based film formation method according to the second embodiment will be described. As described above, the boron-based film does not always have sufficient adhesion to a substrate. Thus, from the viewpoint of preventing film peeling during a device integration manufacturing process, it is required to improve the adhesion of the boron-based film. As techniques for improving the adhesion of a film, generally, there are a technique of performing surface treatment on a substrate (cleaning, surface modification treatment with plasma), and a technique of interposing an interface layer made of different materials and having high adhesion between a substrate and an object film. However, the effect of improving the adhesion of the boron-based film has not been confirmed. Further, when using the interface layers made of different materials, it is necessary to add gases.

Then, as a result of studies, the present inventors have found that, prior to forming a boron-based film, it is effective to form a thin initial boron-based film on a substrate, followed by performing plasma processing to form an intermediate layer, followed by forming the boron-based film.

Boron-Based Film Formation Method According to Second Embodiment

Figure 5:
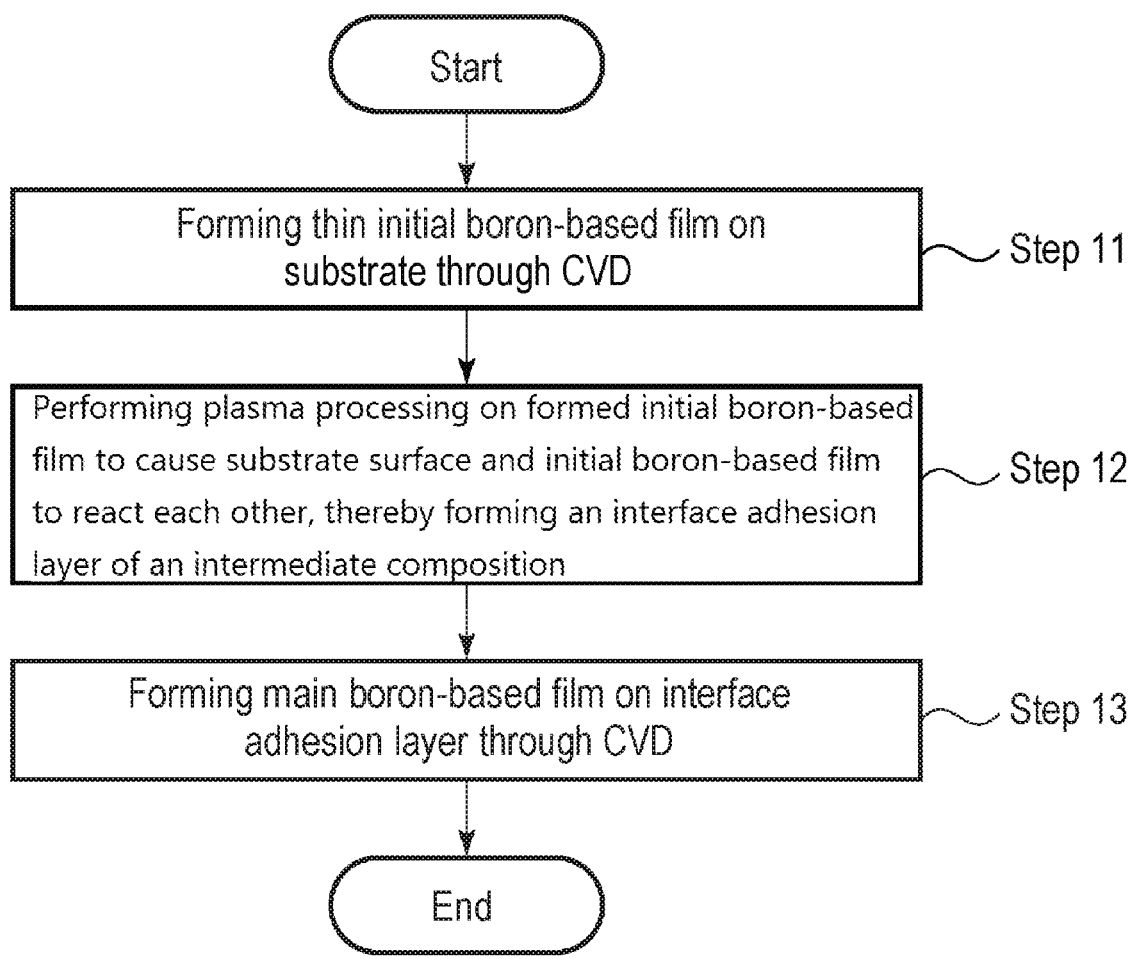
FIG. 5 is a flowchart illustrating a boron-based film formation method according to a second embodiment.
Figure 6:
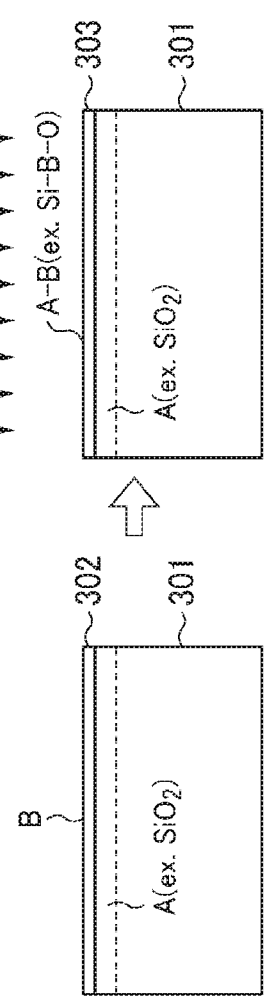
FIGS. 6A to 6C are cross-sectional views schematically illustrating respective steps of the boron-based film formation method according to the second embodiment.

Next, a boron-based film formation method according to the second embodiment will be described. FIG. 5 is a flowchart illustrating the boron-based film formation method according to the second embodiment, and FIGS. 6A to 6C are cross-sectional views schematically illustrating respective processes of the boron-based film formation method according to the second embodiment.

The boron-based film formation method according to the present embodiment includes step 11, step 12, and step 13. Step 11 is a step of forming a thin initial boron-based film 302 on a substrate 301 through CVD (see FIG. 6A). Step 12 performed subsequently is a step of performing plasma processing on the formed initial boron-based film 302 to cause the surface of the substrate and the formed initial boron-based film to react each other, thereby forming an interface adhesion layer 303 having an intermediate composition (see FIG. 6B). Step 13 performed subsequently is a step of forming a main boron-based film 304 on the interface adhesion layer 303 through CVD (see FIG. 6C).

The substrate 301 may be, for example, a semiconductor substrate (semiconductor wafer), typically a silicon substrate. A film such as a SiO$_2$ film or the like may be formed on the surface of the silicon substrate. Examples of the film formed on the surface may include Si—N—O, Si—C—N, Si$_3$N$_4$ or the like.

The formation of the initial boron-based film 302 in step 11 and the formation of the main boron-based film 304 in step 13 are performed through CVD. Either thermal CVD or plasma CVD may be used, but plasma CVD is preferable because a boron-based film having good film quality can be obtained. The plasma of plasma CVD is not particularly limited. For example, capacitively coupled plasma, inductively coupled plasma, microwave plasma or the like may be used. Among these, microwave plasma CVD capable of generating high-density plasma with low damage, which has a low electron temperature and mainly composed of radicals, may be used in forming the boron-based film.

The initial boron-based film 302 and the main boron-based film 304 may be formed through the same film formation method. For example, when the initial boron-based film 302 is formed through the microwave plasma CVD, the main boron-based film 304 may be formed through the microwave plasma CVD.

The initial boron-based film 302 may be thin enough so as to allow ions in the plasma to reach the surface of the substrate to be processed, and may have a thickness of 5 nm or less, specifically 2 nm or less. When the ions in the plasma reach the surface of the substrate to be processed, the surface of the substrate to be processed reacts with the initial boron-based film 302 so that the interface adhesion layer 303 can be effectively formed. The initial boron-based film 302 may have a thickness enough so as to form the interface adhesion layer 303 having a sufficient thickness, specifically 0.5 nm or more.

The boron-based film formed through CVD, particularly the plasma CVD, has a characteristic of high etching resistance. The main boron-based film 304 can be applied as a hard mask by taking advantage of such a characteristic. The thickness of the main boron-based film 304 is appropriately set depending on the intended use. In the case in which the main boron-based film 304 is applied as a hard mask, the main boron-based film 304 is formed to have a thickness of, for example, 1 μm or more.

The boron-based film may be a film mainly composed of boron and containing boron at an amount of 50 at % or more, a boron film composed of boron and inevitable impurities, or a film in which another element, such as nitrogen (N), carbon (C), silicon (Si) or the like, is intentionally added to boron. However, from the viewpoint of obtaining high etching resistance, a boron film containing no other additive element is preferable. A boron-based film formed through CVD mainly contains hydrogen (H) at an amount of about 5 to 15 at % as inevitable impurities which are derived from a film-forming raw material or the like in the film.

When forming a boron-based film through CVD, a processing gas containing a boron-containing gas may be used. When forming a boron-based film through the plasma CVD, a processing gas containing a noble gas for plasma excitation may be used. In the case in which a boron-based film in which another element is added to boron is used, a gas containing an element to be further added may be used as the processing gas. The processing gas may also contain a hydrogen gas.

Examples of the boron-containing gas may include a diborane ($B_2H_6$) gas, a boron trichloride ($BCl_3$) gas, an alkylborane gas, a decaborane gas and the like. The alkylborane gas may be, for example, a trimethylborane ($B(CH_3)_3$) gas, a triethylborane ($B(C_2H_5)_3$) gas, a gas represented by B(R1)(R2)(R3), B(R1)(R2)H, or B(R1)H$_2$ (R1, R2, and R3 are alkyl groups), or the like. Among them, the $B_2H_6$ gas may be appropriately used.

Film formation conditions for the initial boron-based film 302 in step 11 and film formation conditions for the main boron-based film 304 in step 13 may be basically the same. However, since the initial boron-based film 302 is formed at a thin thickness, it is preferable to relatively reduce the flow rate of the boron-containing gas.

When the initial boron-based film 302 and the main boron-based film 304 are formed, the pressure may be in a range of 0.67 to 133.3 Pa (5 to 1,000 mTorr), and the temperature may be 500 degrees C. or less (more specifically, in a range from 60 to 500 degrees C., for example, 300 degrees C.).

Plasma of the noble gas may be used for the plasma processing when forming the interface adhesion layer 303 in step 12. Among the noble gases, an argon gas having a large number of atoms and a large ion-sputtering effect is preferable. By the plasma processing at this time, the surface of the substrate 301 reacts with the initial boron-based film 302 so that the interface adhesion layer 303 having an intermediate composition is formed.

Figure 7:
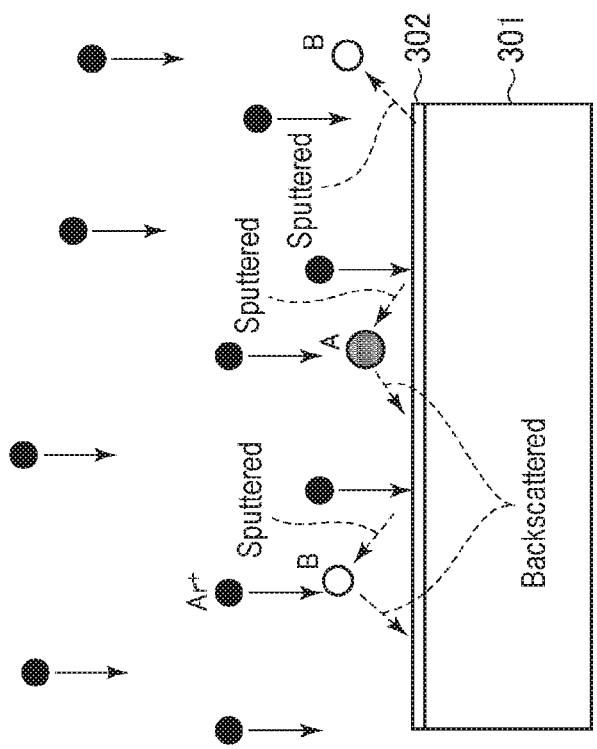
FIG. 7 is a view for explaining the principle of forming an interface adhesion layer through plasma processing after forming an initial boron-based film.

The mechanism used at this time will be described with reference to FIG. 7. When argon plasma is generated after the initial boron-based film 302 is formed, the ions (Ar+) in the plasma are accelerated by a plasma sheath, and the surfaces of the initial boron-based film 302 and the substrate 301 are sputtered. As a result, boron atoms B (B*) are discharged from the initial boron-based film 302, and surface atoms (atoms A (A*)) are discharged from the surface of the substrate 301. These B* and A* are scattered backward by ions (Ar+) in the plasma so that they are redeposited on the substrate 301. As a result, the boron atoms and the surface atoms of the substrate 301 are rearranged on the substrate 301, these atoms are mixed, and the boron atoms and the surface atoms of the substrate 301 react and bond (A-B bond) with each other. Thus, the interface adhesion layer 303 firmly adhering to the substrate 301 is formed.

The reaction at this time is summarized as follows.

[Chemical Formula 1]

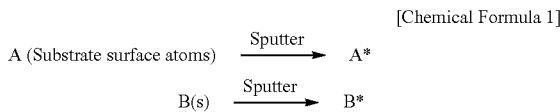

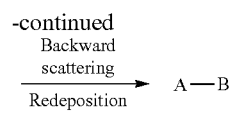

When the surface of the substrate is composed of $SiO_2$, the surface atoms of the substrate 301 are Si and O. Thus, the interface adhesion layer 303 composed of Si—B—O is formed by the following reaction.

[Chemical Formula 2]

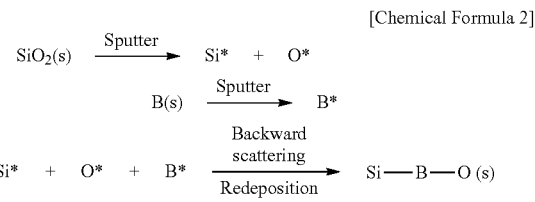

The plasma processing in step 12 is not particularly limited. For example, capacitively coupled plasma, inductively coupled plasma, microwave plasma, or the like, may be used. In the case in which the initial boron-based film 302 is formed through the plasma CVD, it is preferable to use the same plasma source as that used for the initial boron-based film 302.

The pressure and temperature in step 12 may be 0.67 to 133.3 Pa (5 to 1,000 mTorr) and 60 to 500 degrees C., respectively. The processing time may be 10 to 200 sec.

From the viewpoint of enhancing the action of ions on the substrate 301 and the initial boron-based film 302, it is preferable to apply a high-frequency bias to the substrate 301 in the plasma processing in step 12 so as to draw noble gas ions into the substrate to be processed. At this time, the power of the high-frequency bias may be 50 to 500 W, and the power density may be 71 to 710 mW/cm$^2$.

As described above, in the present embodiment, after the initial boron-based film 302 is formed on the substrate 301, the plasma processing is performed to form the interface adhesion layer 303, and the main boron-based film 304 is formed on the interface adhesion layer 303. This makes it possible to form the boron-based film with good adhesion to the substrate 301 compared with the case where the boron-based film is directly formed on the substrate.

That is, since the interface adhesion layer 303 is formed to firmly adhere to the substrate 301 by the plasma processing in step 12, and further, the interface adhesion layer 303 and boron chemically bond with each other, the main boron-based film 304 has good adhesion with respect to the interface adhesion layer 303. As a result, the main boron-based film 304 has good adhesion with respect to the substrate 301.

The formation of the initial boron-based film 301 may be performed using the same gas system as the main boron-based film 304. Further, the plasma processing in step 12 may be performed with the noble gas used when forming the boron-based film. Thus, no additional gas is required.

Steps 11 to 13 may be performed continuously in the same chamber. Thus, it is possible to form the boron-based film with high throughput. In particular, in the case in which the boron-based film is formed through the plasma CVD, it is possible to continuously perform steps 11 to 13 inside the same chamber merely by turning on/off the supply of a film-forming gas such as a boron-containing gas, while maintaining the plasma of noble gas.

All steps 11 to 13 may be performed at a pressure ranging from 0.67 to 133.3 Pa (5 to 1,000 mTorr) and at a temperature ranging 500 degrees C. or less. Steps 11 to 13 may be performed at the same temperature.

First Example of Boron-Based Film Formation Apparatus Used in Second Embodiment

Figure 8:
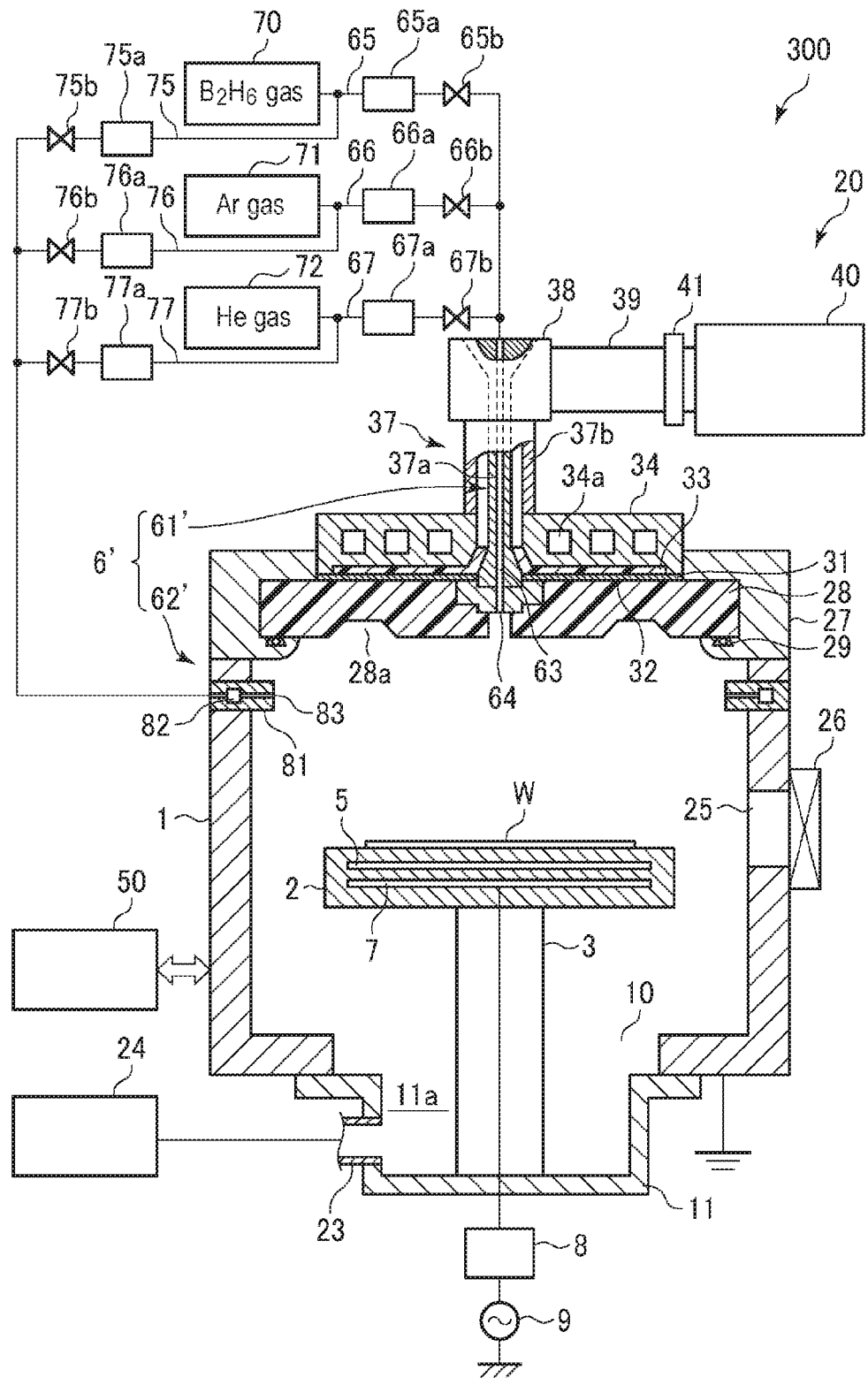
FIG. 8 is a cross-sectional view illustrating a first example of a boron-based film formation apparatus used in the second embodiment.

Next, a first example of a boron-based film formation apparatus will be described. FIG. 8 is a cross-sectional view illustrating the first example of the boron-based film formation apparatus used in the second embodiment. A film formation apparatus 300 of this example is configured as a microwave plasma CVD apparatus for forming a boron film as a boron-based film by performing the above steps 11 to 13.

The film formation apparatus 300 of this example has the same basic configuration as the film formation apparatus 100 illustrated in FIG. 3 used in the first embodiment except that the configurations of the gas sources and the pipes differ from those of the film formation apparatus 100. Accordingly, in FIG. 8, the parts that are the same as those in FIG. 3 will be denoted by the same reference numerals, and a description thereof will be omitted.

The film formation apparatus 300 has a gas supply mechanism 6' configured to supply a processing gas containing a boron-containing gas. As described above, examples of the boron-containing gas may include a diborane ($B_2H_6$) gas, a boron trichloride ($BCl_3$) gas, an alkylborane gas, a decaborane gas, and the like.

The processing gas includes a noble gas for plasma excitation. Further, the processing gas may include a $H_2$ gas or the like. A He gas, an Ar gas, or the like is used as the noble gas. In the following, a case in which a processing gas containing the $B_2H_6$ gas as a boron-containing gas, and the Ar gas and the He gas as noble gases is used will be described by way of an example.

The gas supply mechanism 6' includes a first gas supply part 61' configured to eject gas toward the center of the wafer W, and a second gas supply part 62' configured to eject gas from the outside of the wafer W. The first gas supply part 61' includes a gas flow path 63 formed inside a mode converter 38 and an inner conductor 37a of a coaxial waveguide 37. A gas supply port 64 at the tip end of the gas flow path 63 is opened inward of the chamber 1, for example, at the central portion of a microwave transmission plate 28. Pipes 65, 66, and 67 are connected to the gas flow path 63. A $B_2H_6$ gas source 70 is connected to the pipe 65 to supply the $B_2H_6$ gas that is a boron-containing gas. An Ar gas source 71 is connected to the pipe 66 to supply the Ar gas that is a noble gas. A He gas source 72 is connected to the pipe 67 to supply the He gas that is a noble gas. The pipe 65 is provided with a flow controller 65a, such as a mass flow controller, and an opening/closing valve 65b. The pipe 66 is provided with a flow controller 66a and an opening/closing valve 66b. The pipe 67 is provided with a flow controller 67a and an opening/closing valve 67b.

The second gas supply part 62' includes a shower ring 81 provided in a ring shape along the inner wall of the chamber 1. The shower ring 81 is provided with an annular buffer room 82 and a plurality of gas ejection ports 83 provided so as to face the interior of the chamber 1 at regular intervals from the buffer room 82. Pipes 75, 76, and 77 are branched from the pipes 65, 66, and 67, respectively. The pipes 75, 76, and 77 are joined and are connected to the buffer room 82 of the shower ring 81. The pipe 75 is provided with a flow controller 75a and an opening/closing valve 75b, the pipe 76 is provided with a flow controller 76a and an opening/closing valve 76b, and the pipe 77 is provided with a flow controller 77a and an opening/closing valve 77b.

In this example, each of the first gas supply part 61' and the second gas supply part 62' is supplied with the same type of boron-containing gas or noble gas from the same gas source 70, 71, or 72 with the flow rate of which adjusted. Then, these gases are ejected into the chamber 1 from each of the center of the microwave transmission plate 28 and the periphery of the chamber 1. Separate gases may be supplied separately from the first gas supply part 61' and the second gas supply part 62', respectively. The flow rates of the gases may be adjusted individually.

From the first and second gas supply parts 61' and 62', the processing gases are supplied at a flow rate in a range of, for example, 1,000 to 10,000 sccm, specifically 2,000 to 10,000 sccm in order to enhance a film formation rate of the boron film.

The gas supply mechanism 6' includes the first and second gas supply parts 61' and 62', the $B_2H_6$ gas source 70, the Ar gas source 71, the He gas source 72, the pipes, the flow controllers, the valves, and the like.

In the film formation apparatus 300 configured as above, first, the gate valve 26 is opened, the wafer W, which is a substrate and has, for example, a $SiO_2$ film formed on a silicon base, is loaded into the chamber 1, and is placed on the stage 2. The gate valve 26 is closed.

At this time, the temperature of the stage 2 is set to 500 degrees C. or lower, specifically 60 to 500 degrees C., for example, 300 degrees C. After the chamber 1 is evacuated, the Ar gas and the He gas are caused to flow into the chamber 1 to perform cycle purging. The internal pressure of the chamber 1 due to the Ar gas and the He gas is set to, for example, about 53.3 Pa (400 mTorr) so as to stabilize the temperature of the wafer W. Then, microwaves of 2,000 to 5,000 W (2.8 to 7.1 W/cm$^2$), for example, 3,500 W (5.0 W/cm$^2$) is introduced from the microwave generator 40 to perform plasma ignition. Thereafter, the internal pressure of the chamber 1 is adjusted to 0.67 to 33.3 Pa (5 to 250 mTorr), for example, 6.7 Pa (50 mTorr) while maintaining the microwave power at the same value as that at the time of ignition. The $B_2H_6$ gas, and the Ar gas and the He gas are supplied respectively from the first gas supply part 61' and the second gas supply part 62' to form an initial boron film having a thickness of 5 nm or less as an initial boron-based film. At this time, the $B_2H_6$ gas ($B_2H_6$ concentration: e.g., 15 vol %, He gas dilution) is supplied at a flow rate of 50 to 1,000 sccm, for example, 70 sccm ($B_2H_6$ net: 10.5 sccm). In addition, the Ar gas and the He gas are supplied at a total flow rate of 100 to 1,000 sccm, for example, 500 sccm. During the formation of the initial boron film, it is preferable not to apply a high-frequency bias from the high-frequency power supply for bias voltage application 9 in order to suppress deterioration of the film quality and surface roughness of the boron film and the film peeling in the vicinity of the interface.

After the film formation of the initial boron film is completed, the supply of the $B_2H_2$ gas is stopped, and the He gas and the Ar gas are introduced into the chamber 1 while exhausting the interior of the chamber 1, thereby purging the chamber 1. Then, by using the Ar gas alone and introducing microwaves of a predetermined power into the chamber 1, an Ar-based plasma processing is performed as in the case of forming the initial boron film. At this time, it is preferable to enhance the action of Ar ions by applying a high-frequency bias of 50 to 500 W (71 to 710 mW/cm$^2$), for example, 300 W (420 mW/cm$^2$), from the high-frequency power supply for bias voltage application 9. By the processing using the Ar plasma, an interface adhesion layer formed of, for example, Si—B—O, is formed. The pressure at this time may be in a range of 0.67 to 33.3 Pa (5 to 250 mTorr), specifically in a range of 0.67 to 26.7 Pa (5 to 200 mTorr). The temperature at this time may be the same as that at the time of forming the initial boron film.

After the interface adhesion layer is formed using the Ar plasma, the chamber 1 is purged by introducing the He gas and the Ar gas while evacuating the chamber 1. Then, the $B_2H_6$ gas, the Ar gas, and the He gas are introduced, and the microwaves of predetermined power are introduced to generate microwave plasma, as in the case of forming the initial boron film. Thus, a main boron film having a thickness of, for example, 1 μm or more, is formed. In forming the main boron film, it is preferable to set the flow rate of the $B_2H_6$ gas to be higher than that in the initial boron film. The other conditions may be the same as those in forming the initial boron film. Further, it is preferable not to apply the bias voltage (high-frequency bias) from the high-frequency power supply for bias voltage application 9.

Thus, the formation of the initial boron film, the formation of the interface adhesion layer using the Ar plasma, and the formation of the main boron film are continuously performed in the state in which the wafer W is placed on the stage 2 inside the chamber 1 so as to form a boron film having a desired film thickness. Therefore, it is possible to form the boron film with good adhesion and high throughput without using an additional gas line.

Second Example of Film Formation Apparatus Used in Second Embodiment

Figure 9:
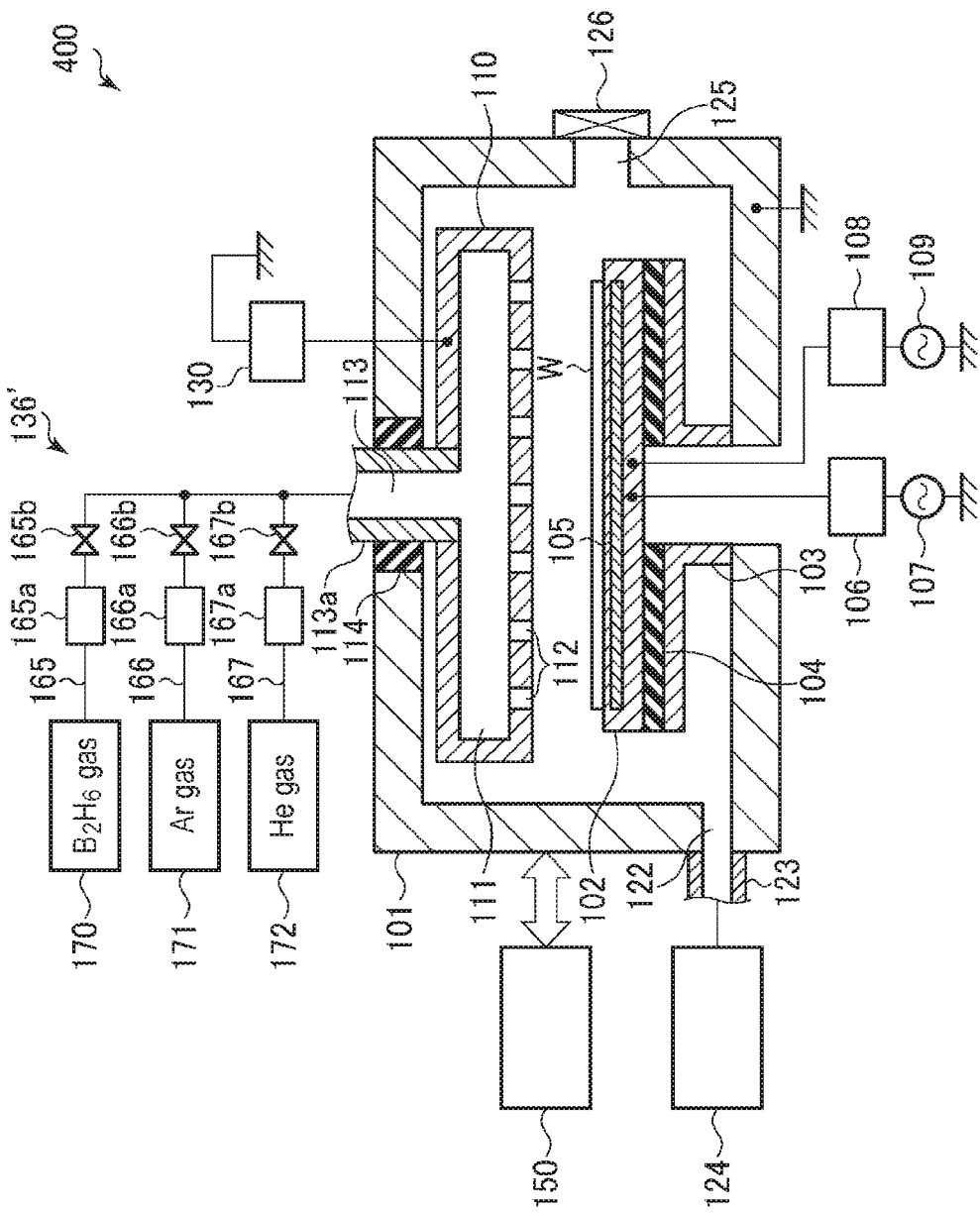
FIG. 9 is a cross-sectional view illustrating a second example of the boron-based film formation apparatus used in the second embodiment.

Next, a second example of a boron-based film formation apparatus used in the second embodiment will be described. FIG. 9 is a cross-sectional view illustrating the second example of the boron-based film formation apparatus used in the second embodiment. A film formation apparatus 400 of this example is configured as a capacitively coupled parallel plate plasma CVD apparatus that forms a boron film as a boron-based film by performing steps 11 to 13 described above, on a semiconductor wafer (hereinafter, simply referred to as a "wafer") as a substrate.

The film formation apparatus 400 of this example has the same basic configuration as the film formation apparatus 200 of the first embodiment described with reference to FIG. 4, and differs from the film formation apparatus 200 in that the film formation apparatus 400 has a gas supply mechanism 136' instead of the gas supply mechanism 136. Accordingly, in FIG. 9, the parts that are the same as those in FIG. 4 will be denoted by the same reference numerals, and a description thereof will be omitted.

The film formation apparatus 400 has the gas supply mechanism 136' for supplying a processing gas containing a boron-containing gas. As described above, examples of the boron-containing gas may include a diborane ($B_2H_6$) gas, a boron trichloride ($BCl_3$) gas, an alkylborane gas, a decaborane gas, and the like.

The processing gas includes a noble gas for plasma excitation. Further, the processing gas may include a $H_2$ gas. A He gas or an Ar gas may be used as the noble gas. In the following, a case in which the processing gas containing the $B_2H_6$ gas as a boron-containing gas, and the Ar gas and the He gas as noble gases is used will be described by way of an example.

The gas supply mechanism 136' includes a gas shower head 110, a $B_2H_6$ gas source 170, an Ar gas source 171, a He gas source 172, and pipes 165, 166, and 167.

The gas shower head 110 is configured similarly to that of the film formation apparatus 200 of FIG. 4. One end of each of the pipes 165, 166, and 167 is connected to a gas flow path 113 connected to the central portion of the top surface of the gas shower head 110. The $B_2H_6$ gas source 170 supplies the $B_2H_6$ gas, which is a boron-containing gas, and is connected to the pipe 165. The Ar gas source 171 supplies the Ar gas, which is a noble gas, and is connected to the pipe 166. The He gas source 172 supplies the He gas, which is a noble gas, and is connected to the pipe 167. The $B_2H_6$ gas, the Ar gas, and the He gas reach a gas diffusion space 111 of the shower head 110 from the gas sources 170, 171, and 172 through the pipes 165, 166, and 167 and the gas flow path 113, respectively, and are ejected from gas ejection holes 112 toward the wafer W within the chamber 101.

The pipe 165 is provided with a flow controller 165a, such as a mass flow controller, and an opening/closing valve 165b. The pipe 166 is provided with a flow controller 166a and an opening/closing valve 166b, and the pipe 167 is provided with a flow controller 167a and an opening/closing valve 167b.

In the film formation apparatus 400 configured as described above, first, a gate valve 126 is opened, the wafer W having the above-described configuration is loaded into the chamber 101 as a substrate and placed on the stage 102, and the gate valve 126 is closed.

The temperature of the stage 102 is set to 500 degrees C. or lower, specifically 60 to 500 degrees C., for example, 300 degrees C. The Ar gas and the He gas are supplied into the chamber 101 to adjust the internal pressure of the chamber 101 to preferably 0.67 to 133.3 Pa (5 to 1,000 mTorr), for example, 50 mTorr (6.7 Pa). Then, while supplying the $B_2H_6$ gas into the chamber 101 at a predetermined flow rate, a first high-frequency power for plasma generation is applied from the high-frequency power supply for plasma generation 107 to the stage 102. As a result, a high-frequency electric field is formed between the gas shower head 110 as an upper electrode and the stage 102 as a lower electrode to generate capacitively coupled plasma. Thus, an initial boron film having a thickness of 2 nm or less is formed as an initial boron-based film through plasma CVD. At this time, it is preferable not to apply the bias voltage (high-frequency bias) from the high-frequency power supply for bias voltage application 109. The gas flow rates at this time may be set in the same range as those in the case of the apparatus of the first example.

After the film formation of the initial boron film is completed, the supply of the $B_2H_2$ gas is stopped, and the He gas and the Ar gas are introduced into the chamber 101 while exhausting the interior of the chamber 101, thereby purging the interior of the chamber 101. Then, the Ar gas alone is used, and capacitively coupled plasma is generated to perform Ar-based plasma processing, as in the case of forming the initial boron film. At this time, it is preferable to enhance the action of Ar ions by applying a high-frequency bias of 50 to 500 W (71 to 710 mW/cm$^2$), for example, 300 W (420 mW/cm$^2$), from the high-frequency power supply for bias voltage application 109. By the processing using the Ar plasma, an interface adhesion layer formed of, for example, Si—B—O, is formed. The pressure at this time may be in a range of 26.7 to 133.3 Pa (200 to 1,000 mTorr). The temperature at this time may be the same as that at the time of forming the initial boron film.

After the interface adhesion layer is formed using the Ar plasma, the chamber 101 is purged by introducing the He gas and the Ar gas while exhausting the interior of the chamber 101. Then, the $B_2H_6$ gas, the Ar gas, and the He gas are introduced into the chamber 101, and the capacitively coupled plasma is generated, as in the case of forming the initial boron film. Thus, a main boron film having a thickness of, for example, 1 μm or more, is formed through plasma CVD. In forming the main boron film, it is preferable to set the flow rate of the $B_2H_6$ gas to be higher than that in the initial boron film. The other conditions may be the same as those in forming the initial boron film. Further, it is preferable not to apply the bias voltage (high-frequency bias) from the high-frequency power supply for bias voltage application 109.

As described above, even in the film formation apparatus of the second example, the formation of the initial boron film, the formation of the interface adhesion layer using the Ar plasma, and the formation of the main boron film are continuously performed in the state in which the wafer W is placed on the stage 102 inside the chamber 101 so as to form a boron film having a desired film thickness. Therefore, it is possible to form a boron film with good adhesion and high throughput without using an additional gas line.

Test Examples of Second Embodiment

Next, test examples of the second embodiment will be described. Here, wafers, each having a $SiO_2$ film formed on a silicon base, were used as substrates, and the microwave plasma CVD apparatus described above with reference to FIG. 8 was used to form boron films through processes of Cases 11 to 13 below.

In Case 11, the boron film was formed through steps 11 to 13 described above, according to the film formation method of the second embodiment. In step 11, microwave power was set to 3,500 W and an initial boron film having a film thickness of 2 nm was formed. In step 12, the Ar-based plasma processing was performed for 90 seconds using the microwave power of 3,500 W and the high-frequency bias (400 kHz) power of 300 W. In step 13, the microwave power was set to 3,500 W and the main boron film having a film thickness of 1 to 1.5 μm was formed.

In Case 12, only step 13 of Case 11 was performed. Further, in Case 13, the surface treatment (treatment of removing a surface contamination portion and OH) by the Ar plasma was first performed for 10 seconds using the microwave power of 3,500 W, and then step 13 of Case 11 was performed.

With respect to the films formed through respective processes of Cases 11 to 13, the adhesion was evaluated using the above-mentioned m-ELT method. Moreover, the situation of each sample at that time was observed. The results are represented in Table 2. The number of samples was 20 in each case.

TABLE 2

| | Case 11 | Case 12 | Case 13 |
|---|---|---|---|
| Adhesion density $K_{IC}$(MPa/m$^{1/2}$) | 0.362 ± 0.022 | 0.335 ± 0.033 | 0.279 ± 0.034 |
| Number of measured samples | 20 | 20 | 20 |
| Number of film-peeled samples | 0 | 6 | 15 |
| Number of peeling-mixed samples | 13 | 14 | 5 |
| Number of substrate-broken samples | 7 | 0 | 0 |

"Number of film-peeled samples", "Number of substrate-broken samples", and "Number of peeling-mixed samples" in Table 2 are the same as those in the test example of the first embodiment. When breakage occurs in a substrate, the obtained adhesion strength value reflects the breakage strength of the substrate. Thus, it is estimated that the adhesion strength at the film interface is stronger than the breakage strength of the substrate. In addition, regarding the samples in which the film peeling and the substrate breakage coexist, it is presumed that the strength available when the film peeling occurred and the strength available when the substrate breakage occurred have the similar values.

As shown in Table 2, in Case 13 in which the boron film is formed after the surface treatment by the Ar plasma is performed, the number of film-peeled samples was 15 and the number of peeling-mixed samples was 5. Thus, the number of film-peeled samples was large. The adhesion strength of the film was as small as 0.279 MPa·m$^{1/2}$. In Case 12 in which the boron film was simply formed on the substrate, the number of film-peeled samples was 6, and the adhesion strength of the film was 0.335 MPa·m$^{1/2}$. Although the adhesion strength was better than that in Case 13, it was an insufficient value. In contrast, in Case 11 in which the boron film was formed through steps 11 to 13 according to the film formation method of the second embodiment, all samples were substrate-broken samples or peeling-mixed samples, and there were no film-peeled samples. The adhesion strength was as high as 0.362 MPa·m$^{1/2}$. From these results, it has been confirmed that the boron film having high adhesion can be obtained by the methods of the embodiments described above.

The second embodiment is summarized as follows.

(1) A boron-based film formation method of forming a boron-based film mainly containing boron on a substrate, the boron-based film formation method including:

forming an initial boron-based film on the substrate through CVD;

subsequently, forming an interface adhesion area by performing a plasma processing on the initial boron-based film and causing a surface of the substrate and the initial boron-based film to react with each other; and subsequently, forming a main boron-based film on the interface adhesion layer through CVD.

(2) In the boron-based film formation method of (1) item, the initial boron-based film is formed to have a thickness of 5 nm or less.

(3) In the boron-based film formation method of (1) item, the forming the initial boron-based film and the forming the main boron-based film are performed through plasma CVD.

(4) In the boron-based film formation method of (1) item, the initial boron-based film and the main boron-based film are boron films composed of boron and inevitable impurities.

(5) In the boron-based film formation method of (1) item, the forming the interface adhesion layer is performed by generating plasma of a noble gas, scattering backward boron atoms and surface atoms, which are respectively discharged from the initial boron-based film and the surface of the substrate through sputtering with ions in the plasma, by the ions in the plasma, so that the boron atoms and the surface atoms are redeposited on the substrate, and causing the boron atoms and the surface atoms to react with each other.

(6) In the boron-based film formation method of (5) item, the surface of the substrate is composed of $SiO_2$, silicon atoms and oxygen atoms are discharged sputtered as the surface atoms by the ions in the plasma when the interface adhesion layer is formed, and Si—B—O is formed as the interface adhesion layer.

(7) In the boron-based film formation method of (1) item, the forming the interface adhesion layer is performed by argon plasma.

(8) In the boron-based film formation method of (1) item, forming the interface adhesion layer is performed by applying a bias voltage based on a high-frequency power to the substrate.

(9) In the boron-based film formation method of (1) item, the forming the initial boron-based film, the forming the interface adhesion layer, and the forming the main boron-based film are continuously performed in the same chamber.

(10) A film formation apparatus for forming a boron-based film mainly containing boron on a substrate, including:
 a chamber in which a substrate is accommodated;
 a stage configured to support the substrate within the chamber;
 a gas supply mechanism configured to supply a processing gas including a boron-containing gas and a noble gas into the chamber; and
 a plasma generation mechanism configured to generate plasma within the chamber; and
 a controller configured to control the gas supply mechanism and the plasma generation mechanism,
 wherein the controller controls:
 the gas supply mechanism to supply a gas including the boron-containing gas so that an initial boron-based film is formed on the substrate through CVD;
 subsequently, the gas supply mechanism to supply the noble gas and the plasma generation mechanism to generate plasma of the noble gas, so that the formed initial boron-based film is subjected to a plasma processing, and a surface of the substrate and the initial boron-based film react with each other to form an interface adhesion layer; and
 subsequently, the gas supply mechanism to supply the gas including the boron-containing gas so that a main boron-based film is formed on the interface adhesion layer through CVD.

(11) In the boron-based film formation apparatus of (10) item, the controller is configured to control the plasma generation mechanism to generate plasma when forming the initial boron-based film and the main boron-based film so that a film formation is performed through a plasma CVD.

(12) In the boron-based film formation apparatus of (11) item, the plasma of the noble gas is an argon plasma.

(13) The boron-based film formation apparatus of (11) item further includes a high-frequency power supply for bias voltage application configured to apply a bias voltage to the substrate on the stage,
 wherein the controller is configured to control the high-frequency power supply for bias voltage application to apply the bias voltage to the substrate when forming the interface adhesion layer.

Other Applications

Although the embodiments have been described above, it should be considered that the embodiments disclosed herein are examples in all respects and are not restrictive. The above-described embodiments may be omitted, replaced, or modified in various forms without departing from the scope and spirit of the appended claims.

For example, in the above embodiments, a boron film was mainly described as the boron-based film. However, in principle, the present disclosure is applicable to another boron-based film obtained by intentionally adding another additive element to boron, such as a boron-rich BN film, a boron-rich BC film, or the like. When forming a boron-based film to which another additive element is intentionally added, a gas containing the additive element may be added as a processing gas during film formation.

In addition, in the embodiments described above, the boron-based film has been described as being used as a hard mask, but the present disclosure is not limited thereto. In a thin film application, the boron-based film may also be applied to other uses such as a barrier film for diffusion prevention.

Further, in the embodiments described above, a microwave plasma CVD apparatus and a capacitively coupled parallel plate plasma CVD apparatus have been described as examples of the film formation apparatus. However, the present disclosure is not limited thereto. The film formation apparatus may use other plasma generation means, or plasma-free thermal CVD. In the first embodiment, PVD such as sputtering may be used instead of CVD.

EXPLANATION OF REFERENCE NUMERALS

201, 301: substrate, 202: adhesion layer, 203: boron-based film, 302: initial boron-based film, 303: interface adhesion layer, 304: main boron-based film

What is claimed is:

1. A boron-based film formation method of forming a boron-based film mainly containing boron on a substrate, the method comprising:
 forming, on the substrate, an adhesion layer including an element contained in a surface of the substrate and nitrogen; and
 subsequently, forming the boron-based film on the adhesion layer,
 wherein the boron-based film is a boron film including boron and inevitable impurities, and
 wherein the forming the adhesion layer and the forming the boron-based film are performed at a same temperature.

2. The boron-based film formation method of claim 1, wherein the adhesion layer is formed to have a thickness of 100 nm or less.

3. The boron-based film formation method of claim 1, wherein the substrate contains silicon provided on a surface of the substrate, and the adhesion layer includes the silicon and the nitrogen.

4. The boron-based film formation method of claim 3, wherein the adhesion layer is one selected from a group consisting of SiN, Si—N:H, Si—C—N, Si—B—N, and Si—O—N.

5. The boron-based film formation method of claim 1, wherein the forming the adhesion layer is performed through a CVD or an ALD.

6. The boron-based film formation method of claim 5, wherein the forming the adhesion layer is performed using a processing gas composed of a gas including the element contained in the surface of the substrate and a gas containing the nitrogen.

7. The boron-based film formation method of claim 5, wherein the forming the adhesion layer is performed through a plasma CVD or a plasma ALD.

8. The boron-based film formation method of claim 7, wherein the forming the adhesion layer is performed using a processing gas composed of a gas including the element contained in the surface of the substrate and a gas including the nitrogen.

9. The boron-based film formation method of claim 1, wherein the forming the boron-based film is performed through a CVD.

10. The boron-based film formation method of claim 9, wherein the forming the boron-based film is performed using a processing gas including a boron-containing gas.

11. The boron-based film formation method of claim 9, wherein the forming the boron-based film is performed through a plasma CVD.

12. The boron-based film formation method of claim 11, wherein the forming the boron-based film is performed using a processing gas including a boron-containing gas.

13. The boron-based film formation method of claim 1, wherein the forming the adhesion layer and the forming the boron-based film are continuously performed in a same chamber.

14. A boron-based film formation apparatus for forming a boron-based film mainly containing boron on a substrate, comprising:
   a chamber in which the substrate is accommodated;
   a stage configured to support the substrate within the chamber;
   a gas supply mechanism configured to supply, into the chamber, a processing gas composed of a boron-containing gas, a gas including an element contained in a surface of the substrate, and a nitrogen-containing gas; and
   a controller configured to control the gas supply mechanism,
   wherein the controller controls:
   the gas supply mechanism to supply the gas including the element contained in the surface of the substrate and the nitrogen-containing gas so that an adhesion layer including the element contained in the surface of the substrate and the nitrogen is formed on the substrate through a CVD or an ALD; and
   subsequently, the gas supply mechanism to supply the gas including the boron-containing gas so that the boron-based film is formed on the interface adhesion layer through the CVD at a same temperature as that at which the adhesion layer is formed, and
   wherein the boron-based film is a boron film including boron and inevitable impurities.

15. The boron-based film formation apparatus of claim 14, further comprising:
   a plasma generation mechanism configured to generate plasma within the chamber,
   wherein the controller controls the plasma generation mechanism to generate the plasma when forming the adhesion layer and the boron-based film so that the adhesion layer is formed through a plasma CVD or a plasma ALD and the boron-based film is formed through the plasma CVD.

16. The boron-based film formation apparatus of claim 14, wherein the substrate includes silicon provided in the surface of the substrate, and the adhesion layer includes the silicon and the nitrogen.

17. The boron-based film formation apparatus of claim 16, wherein the adhesion layer is one selected from a group consisting of SiN, Si—N:H, Si—C—N, Si—B—N, and Si—O—N.

* * * * *